US009669772B2

(12) United States Patent
Kono et al.

(10) Patent No.: US 9,669,772 B2
(45) Date of Patent: Jun. 6, 2017

(54) IMAGING DEVICE AND CIRCUIT BOARD THEREFOR

(71) Applicant: DENSO CORPORATION, Kariya, Aichi-pref. (JP)

(72) Inventors: Keijiro Kono, Kariya (JP); Nobuhisa Shimizu, Kariya (JP); Mitsuru Nakamura, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 15/130,152

(22) Filed: Apr. 15, 2016

(65) Prior Publication Data

US 2016/0307953 A1 Oct. 20, 2016

(30) Foreign Application Priority Data

Apr. 16, 2015 (JP) ................................. 2015-084449

(51) Int. Cl.
| | |
|---|---|
| *H04N 5/335* | (2011.01) |
| *H04N 5/225* | (2006.01) |
| *B60R 11/04* | (2006.01) |
| *H01L 27/146* | (2006.01) |
| *G06K 9/00* | (2006.01) |
| *B60R 11/00* | (2006.01) |

(52) U.S. Cl.
CPC ........ *B60R 11/04* (2013.01); *H01L 27/14618* (2013.01); *B60R 2011/0026* (2013.01); *G06K 9/00798* (2013.01)

(58) Field of Classification Search
CPC .......... H01L 27/14618; H01L 27/1462; H01L 27/1463; B60R 11/04
See application file for complete search history.

(56) References Cited

U.S. PATENT DOCUMENTS

| | | | | |
|---|---|---|---|---|
| 9,066,446 | B1 * | 6/2015 | Olsson | ................. H04N 5/2252 |
| 2014/0035078 | A1 * | 2/2014 | Jan | .................... H01L 27/14618 257/432 |
| 2015/0327398 | A1 * | 11/2015 | Achenbach | .......... H04N 5/2257 348/148 |

(Continued)

FOREIGN PATENT DOCUMENTS

JP 2014-013811 A 1/2014

*Primary Examiner* — Trung Diep
(74) *Attorney, Agent, or Firm* — Knobbe, Martens, Olson & Bear, LLP

(57) ABSTRACT

In an imaging device, an image-sensor board is housed in a metallic case, and includes first and second regions. The first region includes first conductor patterns and first insulators constituting a multilayer structure, a first outermost surface on which an image sensor is mounted, and a second outermost surface. The second region includes second conductor patterns and second insulators constituting a multilayer structure. A control circuit board is electrically connected to the first conductor patterns via the second outermost surface. A thermal transfer member is disposed to be in contact with the second region of the image-sensor board for transferring heat generated from the image sensor to the case. The second conductor patterns in the second region include a closest conductor pattern located closest to the thermal transfer member. The closest conductor pattern is electrically isolated from the first conductor patterns.

14 Claims, 17 Drawing Sheets

(56) References Cited

U.S. PATENT DOCUMENTS

2015/0358564 A1* 12/2015 Kang .................... H04N 5/2253
    348/244
2015/0362172 A1* 12/2015 Gabriel ................ G08B 15/001
    348/151

* cited by examiner

IMAGING DEVICE AND CIRCUIT BOARD THEREFOR

CROSS REFERENCE TO RELATED APPLICATION

This application is based on and claims the benefit of priority from Japanese Patent Applications No. 2015-084449 filed on Apr. 16, 2015, the disclosure of which is incorporated in its entirety herein by reference.

TECHNICAL FIELD

The present disclosure relates to imaging devices each including a circuit board to which an imaging sensor is mounted; the imaging sensor serves as both a noise source and a heat source. More particularly, the present disclosure relates to circuit boards used for such imaging devices.

BACKGROUND

Common electronic devices include printed circuit to which electronic components serving as heat sources are mounted. One example of which is disclosed in Japanese Patent Application Publication No. 2014-13811.

Such an electronic device includes a printed circuit board to which such an electronic component is mounted, and a metallic housing in which the printed circuit board is installed. The printed circuit board is fastened to the housing with a screw while the screw serves as a heat dissipator for dissipating heat from the printed circuit board to the metallic housing. The electronic device is also configured to prevent disturbance noise from being transferred from the metallic housing to the printed circuit board via the screw.

Specifically, the printed circuit board is designed as a multilayer board comprised of separated conductor layers electrically isolated from each other. The conductor layers are fastened with the screw. The conductor layers include a metallic layer disposed at the inner side of the outermost layer thereof. The metallic layer extends from the lower side of the electronic component to the portion inside the multilayer board, which is pressed by the screw. The metallic layer is also electrically isolated from wiring patterns printed on the respective conductor layers.

The extension of the metallic layer up to the portion inside the multilayer board, which is pressed by the screw, increases the thermal contact conductance of the multilayer board through the metallic layer, resulting in an increase of the heat dissipation performance of the electronic device. The electrical insulation of the metallic layer from the wiring patterns prevents disturbance noise from being transferred from the metallic housing to the electronic element via the wiring patterns.

SUMMARY

Imaging devices including a circuit board to which an imaging sensor is mounted may also have a requirement for a higher heat dissipation structure and a higher noise reduction structure, because the imaging sensor serves as both a noise source and a heat source. That is, an imaging device including a circuit board to which an imaging sensor is mounted may generate heat and noise, and the noise may be transferred via the metallic housing as radiation noise.

In view this requirement, one aspect of the present disclosure seeks to provide imaging devices including an imaging sensor that produces heat and noise; each of the imaging devices has a higher heat dissipation structure and a higher noise reduction structure. Additionally, an alternative aspect of the present disclosure aims to provide circuit boards to be used for such imaging devices.

According to a first exemplary aspect of the present disclosure, there is provided an imaging device. The imaging device includes a metallic case including an opening. The imaging device includes an image sensor housed in the case and configured to pick up, through the opening, an image of an outside of the case and to output a signal indicative of the picked-up image. The imaging device includes an image-sensor board housed in the case and including a first region and a second region. The first region includes a plurality of first conductor patterns and a plurality of first insulators. The first conductor patterns and the first insulators constitute a multilayer structure. The first conductor patterns are electrically connected to each other. The first region includes a first outermost surface on which the image sensor is mounted, and a second outermost surface opposite to the first outermost surface. The second region includes a plurality of second conductor patterns and a plurality of second insulators. The second conductor patterns and the second insulators constitute a multilayer structure. The imaging device includes a control circuit board electrically connected to the first conductor patterns via the second outermost surface so that the signal output from the image sensor is transferred to the control circuit board via the first conductor patterns. The imaging device includes a thermal transfer member disposed to be in contact with the second region of the image-sensor board for transferring heat generated from the image sensor to the case. The second conductor patterns in the second region include a closest conductor pattern located closest to the thermal transfer member. The closest conductor pattern is electrically isolated from the first conductor patterns.

According to a second exemplary aspect of the present disclosure, there is provided an image sensor board. The image sensor board includes a first region. The first region includes a plurality of first conductor patterns, and a plurality of first insulators. The first conductor patterns and the first insulators constitute a multilayer structure, and the first conductor patterns are electrically connected to each other. The first region includes a first outermost surface on which an image sensor is to be mounted, and a second outermost surface opposite to the first outermost surface. The image sensor board includes a second region. The second region includes a plurality of second conductor patterns, and a plurality of second insulators. The second conductor patterns and the second insulators constitute a multilayer structure. The first conductor patterns are electrically connectable to a control circuit board via the second outermost surface. The imaging device includes a thermal transfer member disposed to be in contact with the second region of the image-sensor board for transferring heat generated from the image-sensor board. The second conductor patterns in the second region include a closest conductor pattern located closest to the thermal transfer member. The closest conductor pattern is electrically isolated from the first conductor patterns.

The first region of the image-sensor board according to each of the first and second exemplary aspects of the present disclosure establishes electrical connection between the image sensor and the control circuit board. The second region of the image-sensor board according to each of the first and second exemplary aspects of the present disclosure causes the image sensor to be electrically isolated from the thermal transfer member and the case. This enables the occurrence of radiation noise caused by noise generated by the image sensor to be reduced while enabling heat generated from the image sensor to be efficiently dissipated from the case.

The above and/or other features, and/or advantages of various aspects of the present disclosure will be further appreciated in view of the following description in conjunction with the accompanying drawings. Various aspects of the present disclosure can include and/or exclude different features, and/or advantages where applicable. In addition, various aspects of the present disclosure can combine one or more feature of other embodiments where applicable. The descriptions of features, and/or advantages of particular embodiments should not be construed as limiting other embodiments or the claims.

BRIEF DESCRIPTION OF THE DRAWINGS

Other aspects of the present disclosure will become apparent from the following description of embodiments with reference to the accompanying drawings in which.

DETAILED DESCRIPTION OF EMBODIMENT

The following describes the first to fifth embodiments of the present disclosure with reference to the accompanying drawings.

First Embodiment

Figure 4:
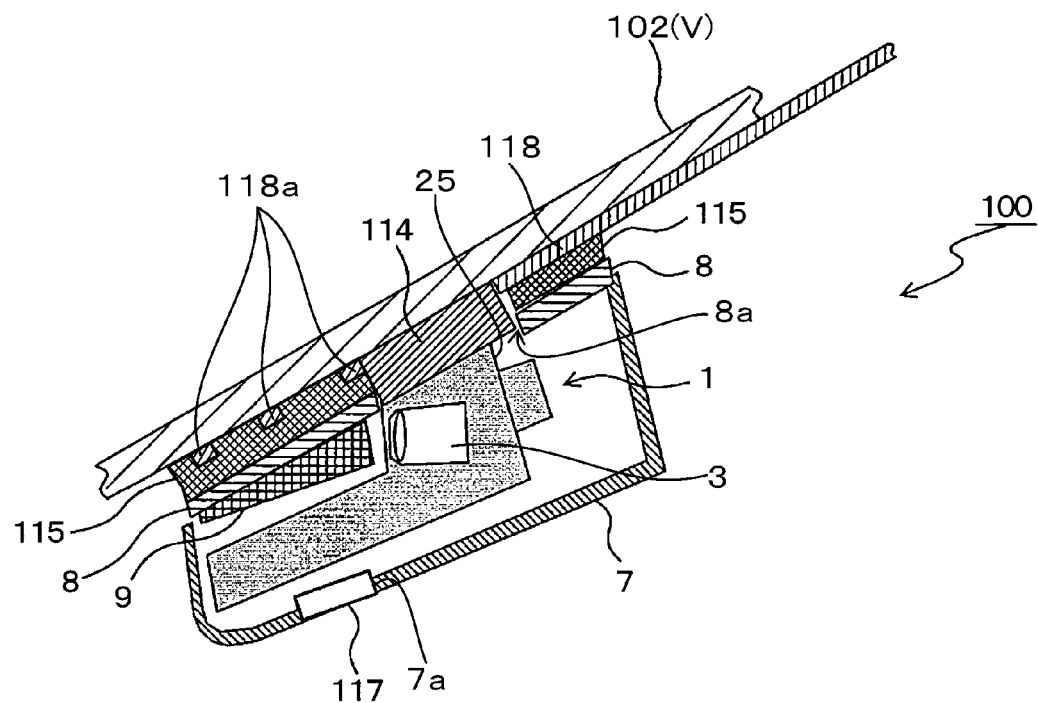
FIG. 4 is a cross sectional view schematically illustrating the camera system including the imaging device when attached to the front windshield of the vehicle.

An imaging device 1 according to the first embodiment is installed in, for example, a vehicle V, a part, such as a front windshield, of which is illustrated in FIG. 4. The imaging device 1 picks up images of a region ahead of the vehicle V. The imaging device 1 also performs analyses on the picked-up images, and sends the results of analyses to one or more ECUs, such as headlight control ECU and a lane departure detection ECU, installed in the vehicle V.

In the specification, the front, rear, right, and left directions described show the front, rear, right, and left directions of the vehicle V when the vehicle V is travelling in the front direction of the vehicle V. The front-rear direction corresponds to the longitudinal direction of the vehicle V, and the right-left direction corresponds to the lateral direction, i.e. the width direction, of the vehicle V.

Figure 1:
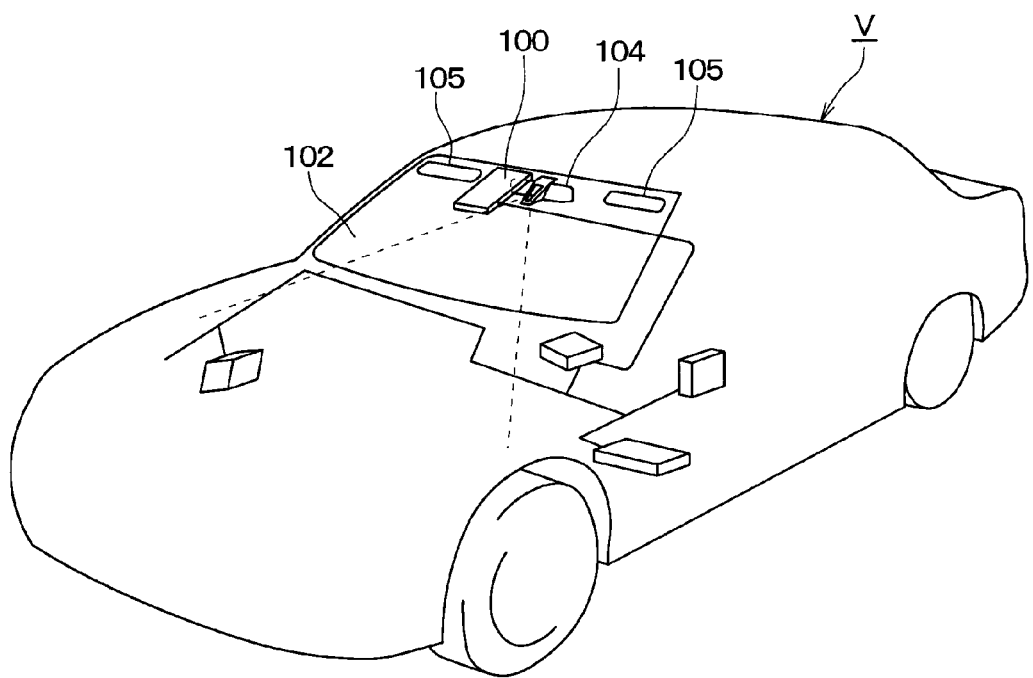
FIG. 1 is a perspective view schematically illustrating an example of a vehicle in which a camera system according to the first embodiment of the present disclosure is installed.

Specifically, the imaging device 1 according to the first embodiment constitutes a camera system 100 illustrated in FIG. 1. The camera system 100 is, for example, disposed in a compartment of the vehicle V and placed at the upper side of a windshield 102 of the vehicle V in adjacent to a rearview mirror of the vehicle V. The camera system 100 controls the imaging device 1 so that the imaging device 1 picks up images of the region ahead of the vehicle V (see dashed lines in FIG. 1). The place where the camera system 100 including the imaging device 1 is located is subject to heat from the sun so that the camera system 100 likely has a high temperature. Thus, the camera system 100 requires stable operations at high temperatures. For example, the camera system 100 requires stable operations when the vehicle V is running during daylight in a hot region. As described later, the imaging device 1 includes an image sensor, i.e. a solid-state image sensor, 33a (see, for example, FIG. 10). The image sensor 33a can serve as both a heat source and a noise source. For this reason, efficient dissipation of heat generated from the image sensor 33a enables stable operations of the camera system 100 under high temperatures.

An antenna unit 105 for a digital television set and/or a radio device installed in the vehicle V is adhered to the upper side of the windshield 105, which is close to the image sensor 33a. This results in the antenna unit 105 being susceptible to noise generated from the image sensor 33a. For this reason, efficient reduction of noise generated from the image sensor 33a enables arrangement of the imaging device 1 at the upper side of the windshield 102.

Figure 2A:
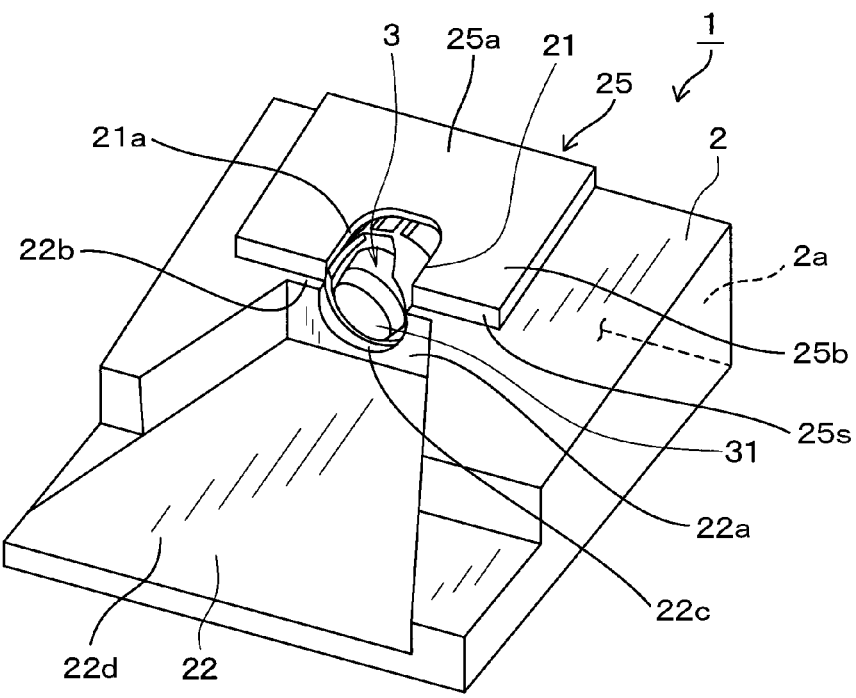
FIG. 2A is a perspective view schematically illustrating an example of the appearance of an imaging device according to the first embodiment of the present disclosure.
Figure 2B:
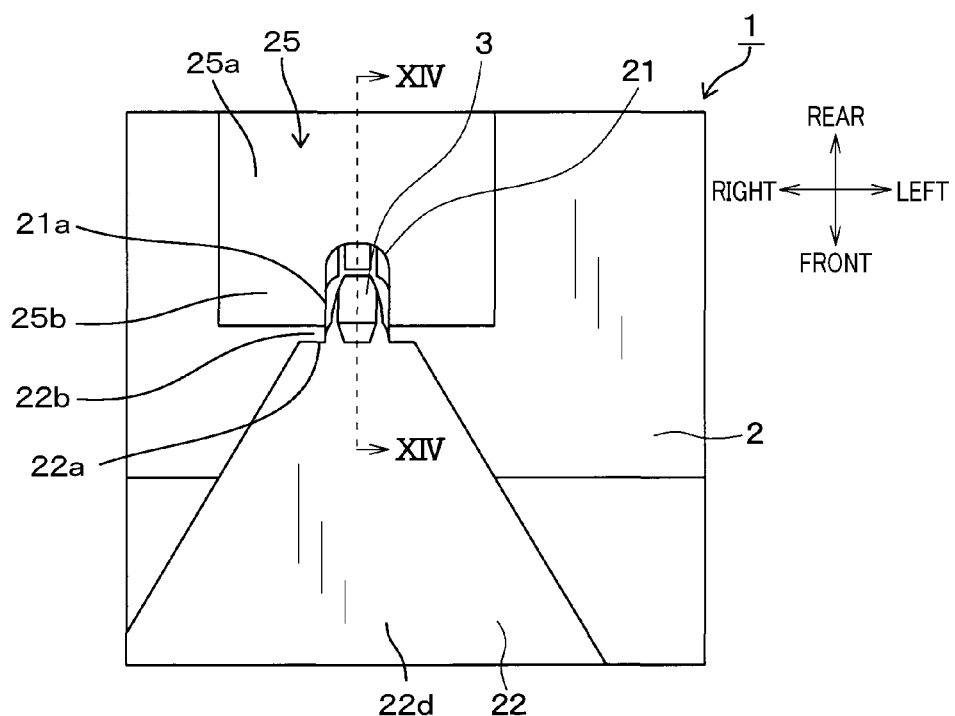
FIG. 2B is a plan view of the imaging device illustrated in FIG. 1.

Referring to FIGS. 2A and 2B, the imaging device 1 is comprised of a housing 2 and a camera module 3 installed in the housing 2. The housing 2 is made of, for example, metal, such as aluminum, and has a substantially rectangular parallelepiped shape with an inner hollow container space. The housing 2 has a rear wall 2a directed to the rear side of the vehicle V when the imaging device 2 is installed in the vehicle V.

The housing 2 has a top wall 2b inclined toward the front side of the vehicle V. A rectangular part of a rear half portion of the top wall 2b is protruded upward to form a protruded wall 25; the protruded wall 25 is located to be slightly shifted rightward relative to the middle of the rear half portion in the lateral direction of the housing 2.

The protruded wall 25 serves as an attachment wall to, for example, the front windshield 102 of the vehicle V described later (see FIG. 4). Hereinafter, the protruded wall 25 will be referred to as an attachment wall 25.

The attachment wall 25 has a substantially U-shaped concave recess 21a formed in a front surface 25S thereof to a substantially center of the attachment wall 25, so that a top surface of the attachment wall 25 has a substantially concave shape. In other words, the attachment wall 25 is comprised of a left-hand end 26 and a right-hand end 27 that sandwiches the U-shaped concave recess 21a.

The housing 2 has a trapezoidal concave recess 22 formed in the top surface 2b downward. The trapezoidal concave recess 22 has a vertical wall 22a located close to the front surface 25s of the attachment wall 25. The vertical wall 22a has a top surface 22b intersecting with the front surface 25s of the attachment wall 25, so that the vertical wall 22a and the attachment wall 25 constitute a downward stepped portion. The vertical wall 22a has a concave recess 22c formed in the top surface 22b and communicating with the U-shaped concave recess 21a. The U-shaped concave recess 21a and the concave recess 22c constitute an opening 21 for communicating between the exterior and interior of the housing 2.

The trapezoidal concave recess 22 has a bottom surface 22d having a substantially trapezoidal shape. The trapezoidal bottom surface 22d extends, from the vertical wall 22a, in the front direction such that the extending lower base of the trapezoidal bottom surface 22d is longer than the upper base thereof.

The opening 21 consisting of the U-shaped concave recess 21a and the concave recess 22c, and the trapezoidal concave recess 22 serve as an aperture structure (21, 22) that causes a part of a lens assembly 3A of the camera module 3 installed in the housing 2 to be exposed from the housing 2, i.e. uncovered. This permits the lens assembly 3A to receive light from the front of the vehicle V, and the camera module 3 to pick up images ahead of the vehicle V based on the received light. In other words, the aperture structure (21, 22) permits the housing 2 not to interfere with the field of view of the lens assembly 3A, i.e. the camera module 3.

Figure 3:
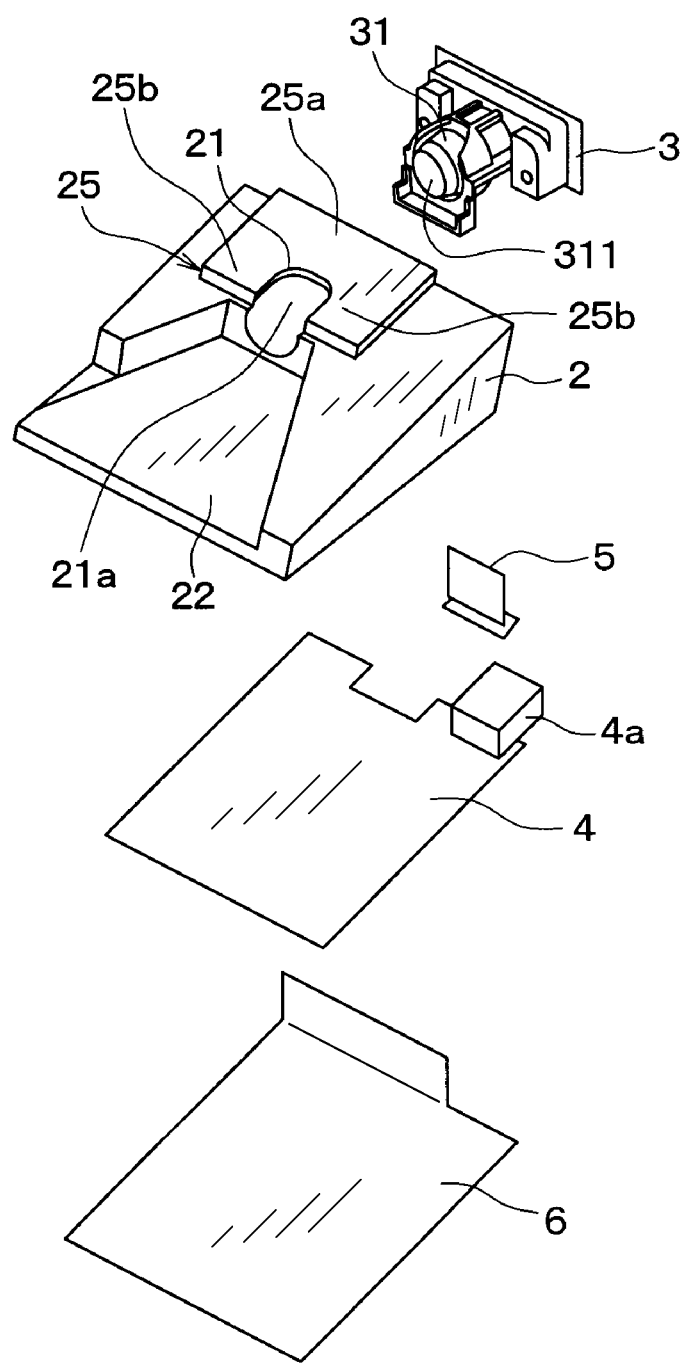
FIG. 3 is an exploded perspective view of the imaging device illustrated in FIG. 1.

Referring to FIG. 3, the imaging device 1 is also comprised of a control circuit board 4, an electrical connection harness 5, and a bottom cover 6. The camera module 3 is disposed above the control circuit board 4 and the electrical connection harness 5 such that the opening 21 faces the control circuit board 4. The electrical connection harness 5 electrically connects electrical parts of the camera module 3 and the control circuit board 4. The bottom cover 6 is disposed at a lower side of the control circuit board 4 so as to be integral with a bottom wall of the housing 2. That is, the camera module 6, the control circuit board 4, the electrical connection harness 5 are contained in the assembly of the housing 2 and the bottom cover 6, so that the imaging device 1 is constructed. For example, crimping a part of the bottom cover 6 causes the bottom cover 6 to be fixed to the housing 2. The bottom cover 6 can be fixed to the housing 2 using one of various measures. For example, the bottom cover 6 can be threaded or adhered to the housing 2.

The imaging device 1 constitutes a camera system 100 serving as an example of imaging apparatuses attached to the vehicle V. The camera system 100 is for example attached to the top center of the inner surface of the front windshield 102 of the vehicle V. In other words, the camera system 100 is located to be close to a rearview mirror of the vehicle V.

Figure 5:
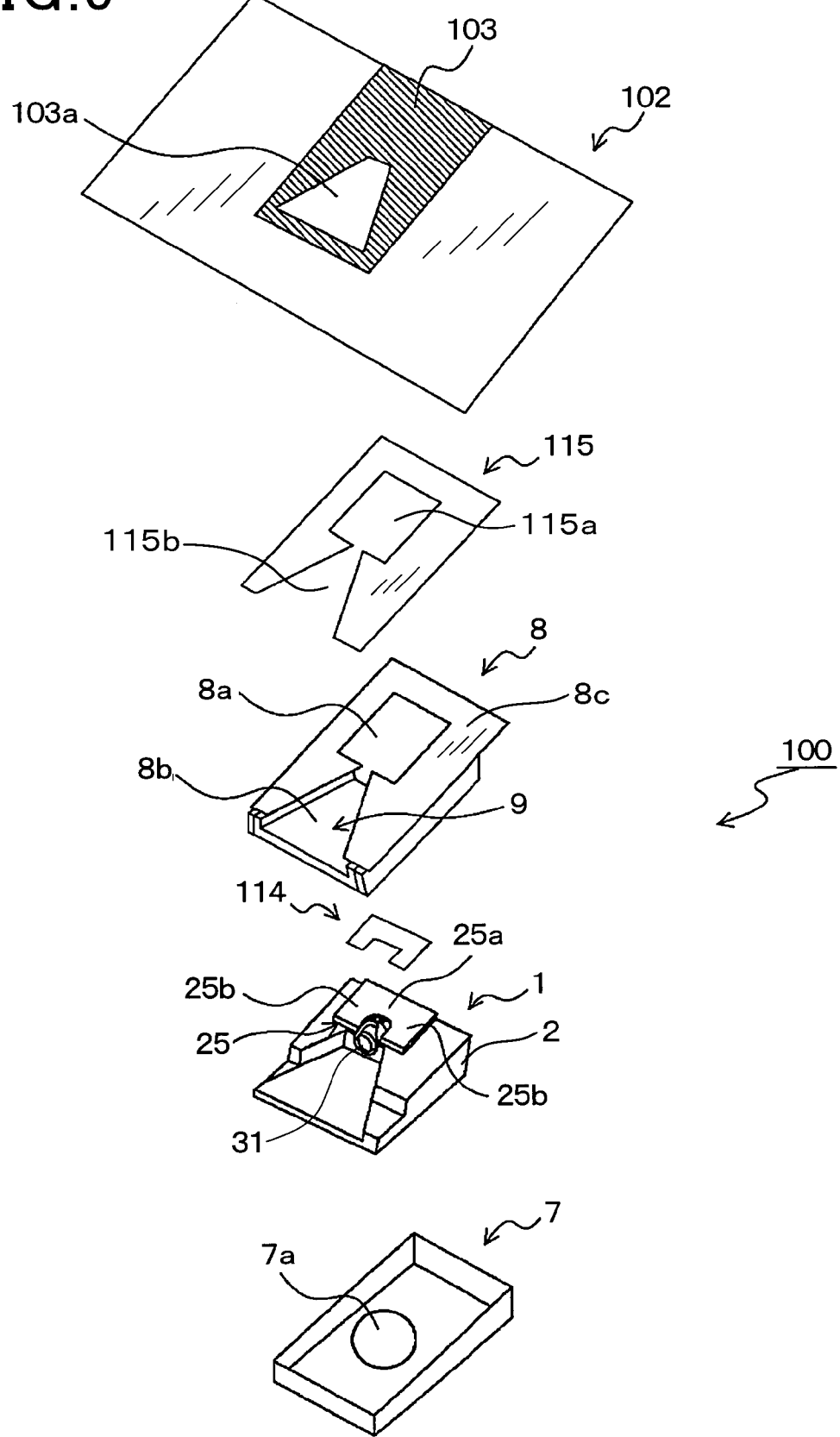
FIG. 5 is an exploded perspective view schematically illustrating the camera system illustrated in FIG. 4.

The camera system 100 includes a plate-like bracket 8, a hood 9, a first thermal-conductive member 114, a second thermal-conductive member 115, a design cover 7, a ventilation fan 117, and a hot wire 118 in addition to the imaging device 1. FIGS. 4 and 5 schematically illustrate a part of the front windshield 102. In FIG. 5, the ventilation fan 117 and hot wire 118 are eliminated in illustration for simpler description of the camera system 100.

Referring to FIGS. 4 and 5, the design cover 7 has a rectangular-parallelepiped shape with an inner hollow container therein and an opening top wall. The imaging device 1 is contained in the inner hollow container of the design cover 7 such that the bracket 8 covers the top of the imaging device 1 while the hood 9 covers the trapezoidal concave recess 22.

The bracket 8 is attached via the second thermal-conductive member 115 to the top center of the inner surface of the front windshield 102 located close to the rearview mirror, more specifically located behind the rearview mirror.

Specifically, the bracket 8 has an opening 8a facing at least part of the top surface of the attachment wall 25 of the housing 2. The bracket 8 also has a substantially V-shaped recess, in other words, notch, 8b communicating with the opening 8a and facing the trapezoidal concave recess 22 of the housing 2; the opening 8a and the V-shaped recess 8b result in the bracket 8 having a substantially U shape. The bracket 8 serves to fix the housing 2 of the imaging device 1 to the inner surface of the front windshield 102. Specifically, the bracket 8 has a first major surface, i.e. a top surface, 8c fixedly mounted, for example, adhered, on the inner surface of the front windshield 102 via the second thermal-conductive member 115. The housing 2 is attached to the bracket 8 fixedly mounted on the inner surface of the front windshield 102 such that the attachment wall 25 of the housing 2 faces the front windshield 102 via the first thermally-conductive member 114.

When the housing 2 is attached to the bracket 8, the V-shaped recess 8b is located in front of the camera module 3. The V-shaped recess 8b has a substantially trapezoidal shape so as to become broader in width toward the front side of the camera module 3; the recess 8b corresponds in shape to a horizontally sector imaging region, i.e. a horizontal view-angle region, of the lens assembly 3A of the camera module 3 extending in front of the lens assembly 3A. This permits the field of view of the lens assembly 3A, i.e. the camera module 3, to be sufficiently ensured.

The hood 9 is made of a resin, and has a substantially trapezoidal bottom surface, and a pair of opposing side surfaces perpendicular to respective oblique sides of the trapezoidal bottom surface. The hood 9 is attached to a lower side of the bracket 8 with the trapezoidal bottom surface facing the recess 8b. Specifically, when the housing 2 is attached to the bracket 8, the hood 9 is mounted on or above the trapezoidal bottom surface 22d of the trapezoidal concave recess 22 such that the bottom surface and the opposing side surfaces of the hood 9 surround the substantially sector imaging region (horizontal view-angle region) of the camera module 3. The imaging region substantially corresponds to the field of view of the lens assembly 3A This reduces the possibility that objects located outside of the sector imaging region of the camera module 3 are captured by the camera module 3.

The first thermal-conductive member 114 is designed as a seat member made of, for example, a silicone material having a thermal conductivity from 1 to 50 [W/m·K] inclusive. The first thermal-conductive member 114 is located between the attachment wall 25 of the housing 2 and the front windshield 102 via the opening 8a. For example, in the first embodiment, the first thermal-conductive member 114 is adhered on the top surface of the attachment wall 25. Thereafter, the first thermal-conductive member 114 is fixed to the inner surface of the front windshield 102 via the second thermal-conductive member 115 while the first thermal-conductive member 114 and/or a top portion of the attachment wall 25 is fitted or placed in the opening 8a of the bracket 8. This results in the first thermal-conductive member 114 being adhered on the inner surface of the front windshield 102.

The first thermal-conductive member 114 has a shape and an area substantially identical to the shape and area of the top surface of the attachment wall 25. Specifically, the first thermal-conductive member 114 has a substantially concave shape and is fixedly mounted on regions 25b of the respective left-hand and right-hand ends 26 and 27 of the attachment wall 25 located both sides of the U-shaped concave recess 21a. The first thermal-conductive member 114 is also fixedly mounted on a region 25a of the concave top surface of the attachment wall 25 located behind the U-shaped concave recess 21a.

The second thermal-conductive member 115 is designed as a seat member made of, for example, the same material as the material of the first thermal-conductive member 114. The second thermal-conductive layer 115 is disposed between the top surface 8c of the bracket 8 and the inner surface of the front windshield 102 so as to be fixedly mounted on both the top surface 8c of the bracket 8 and the inner surface of the front windshield 102.

The second thermal-conductive member 115 has a shape and an area substantially identical to the shape and area of the top surface 8c of the bracket 8. Specifically, the second thermal-conductive member 115 has an opening 115a facing the opening 8a of the bracket 8, and a substantially V-shaped recess 115b communicating with the opening 115a and facing the V-shaped recess 8b of the bracket 8; the opening 115a and the V-shaped recess 115b result in the second thermal-conductive member 115 has a substantially U shape.

The second thermal-conductive member 115 is adhered on the whole of the top surface 8c of the bracket 8 and on the inner surface of the front windshield 102 while the opening 115a and recess 115b are aligned with the respective opening 8a and recess 8b. For example, the second thermal-conductive member 115 is attached on both the whole of the top surface 8c of the bracket 8 and the inner surface of the front windshield 102 with adhesives.

In the first embodiment, in order to reduce external visual recognition of the adhesive between the second thermal-conductive member 115 and the inner surface of the front windshield 102, the second thermal-conductive member 115 is adhered on a black ceramic sheet 103 having an area larger than the area of the second thermal-conductive member 115. Thereafter, the black ceramic sheet 103 is closely contacted on the inner surface of the front windshield 102. The black ceramic sheet 103 has a transparent opening 103a facing the V-shaped recess 115b of the second thermal-conductive member 115. The transparent opening 103a prevents the black ceramic sheet 103 from blocking the sector imaging region of the camera module 3.

The design cover 7 covers the bracket 8 and the hood 9 from the lower direction of them in addition to the imaging device 1 to reduce the possibility of the bracket 8 and hood 9 being visible from the inside of the vehicle V. The design cover 7 has a through hole 7a formed through a bottom wall; the ventilation fan 117 is fitted in the through hole 7a (see FIG. 4). The ventilation fan 117 ventilates the compartment of the vehicle V.

The hot wire 118 is designed as, for example a single copper wire having both ends connected to a power supply source (not shown) installed in the vehicle V, and the hot wire 118 generates heat when energized by the power supply source. For example, the hot wire 118 has a bent portion 118a shaped like a letter S, and is arranged on an inner surface of the black ceramic sheet 103 such that the S-shaped bent portion 118a is located on the inner side of the trapezoidal opening 103a. Specifically, the S-shaped bent portion 118a has substantially three linear portions and two corners joining between the three linear portions to form the substantially S shape. The S-shaped bent portion 118a is located on the trapezoidal opening 103a while the three linear portions pass through the trapezoidal opening 103a in the lateral direction of the black ceramic sheet 103. This permits the front side space of the lens assembly 3A of the camera module 3 located below the trapezoidal opening 103a to be efficiently heated.

Figure 6:
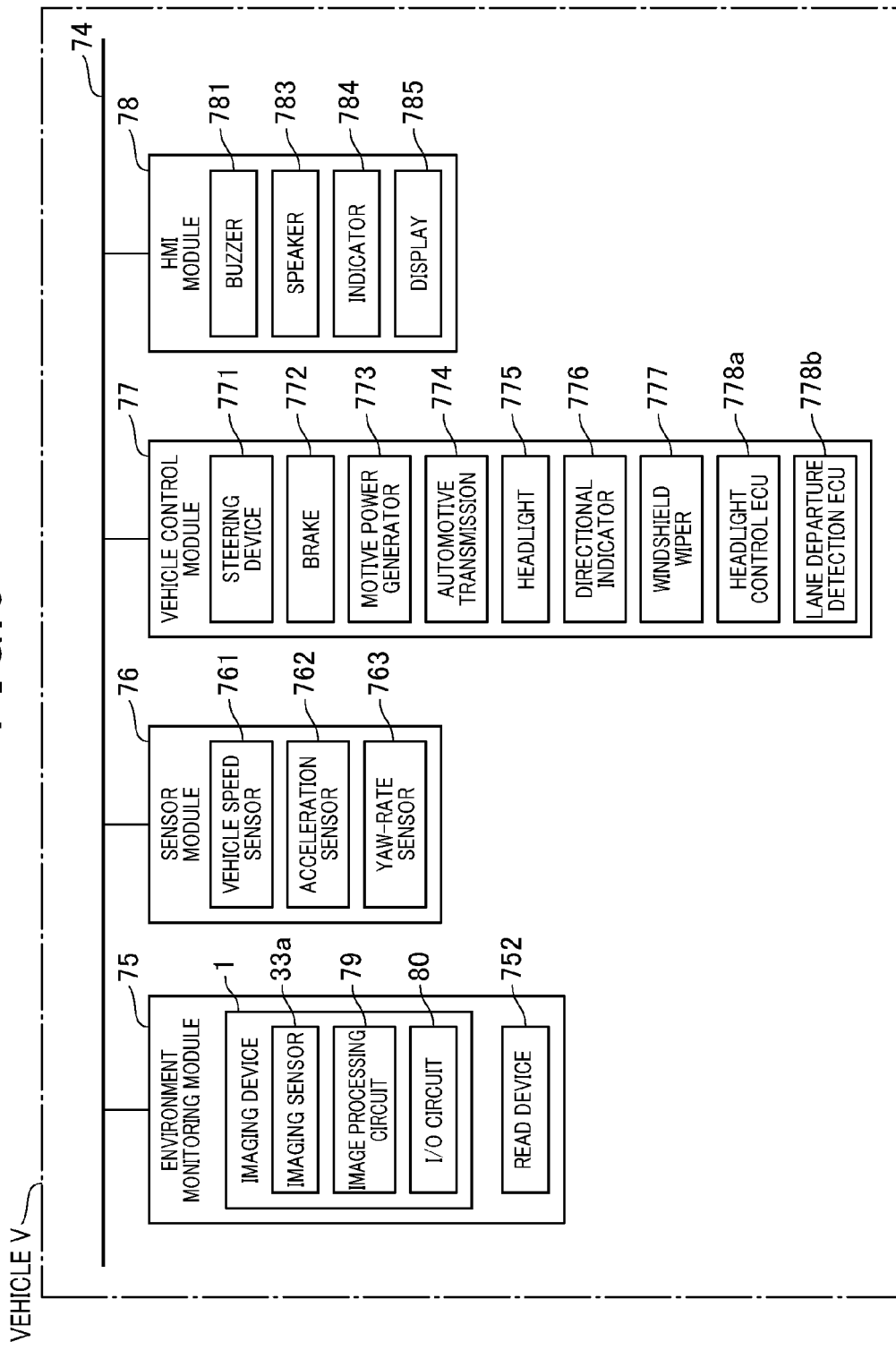
FIG. 6 is a block diagram schematically illustrating an example of a part of a functional structure of the vehicle including an example of the functional structure of the camera system.

Next, electrical functions of the camera system 100 will be described hereinafter with reference to FIG. 6. FIG. 6 schematically illustrate an example of a part of the functional structure of the vehicle V including an example of the functional structure of the camera system 100. In FIG. 6, electrical components of the imaging device 1 only are illustrated while other mechanical elements of the imaging device 1, such as the bracket 8 and hood 9, are eliminated in illustration.

Referring to FIG. 6, the vehicle V includes an environment monitoring module 75, a sensor module 76, a vehicle control module 77, an HMI (Human Machine Interface) module 78, and a common serial interactive communication bus 74 with which the modules 75 to 78 are communicably coupled.

The environment monitoring module 75 is equipped with, for example, the imaging device 1 and a radar device 752, which serve as devices for monitoring the environmental situations around the vehicle V. The environment monitoring module 75 can include, for example, a right side-view camera, a left side-view camera, and a rear-view camera. The right side-view camera is for example attached to the right side-view mirror of the vehicle V for picking up images of right-hand views from the vehicle V. The left side-view camera is for example attached to the left side-view mirror for picking up images of left-hand views from the vehicle V. The rear-view camera is for example attached to the rear bumper of the vehicle V for picking up rear views from the vehicle V.

The imaging device 1 includes the image sensor 33a, an image processing circuit 79, and an input/output (I/O) circuit 80 described in detail later.

The radar device 752 is operative to transmit probing waves, such as radar waves or laser waves to a predetermined scan region, and receive echoes from at least one object based on the transmitted probing waves. Based on the received echoes, the radar device 752 is operative to generate object information including at least (1) The distance of the at least one object relative to the vehicle V (2) The relative speed of the at least one object with respect to the vehicle V if the at least one object is a moving object (3) The lateral position of the at least one object relative to the vehicle V in the lateral direction of the vehicle V.

The radar device 752 can include a sonar for transmitting ultrasonic waves as the probing waves and for receiving echoes based on the ultrasonic waves from at least one object.

The sensor module 76 is operative to measure the operating conditions, i.e. travelling conditions, of the vehicle V. Specifically, the sensor module 76 includes a vehicle speed sensor 761, an acceleration sensor 762, a yaw-rate sensor 763, and so on.

The vehicle speed sensor 761 is operative to measure the speed of the vehicle V, and operative to output, to the bus 74, a sensor signal indicative of the measured speed of the vehicle V.

The acceleration sensor 762 is operative to measure acceleration, for example, lateral acceleration, of the vehicle V in the vehicle width direction, and output, to the bus 74, a sensor signal indicative of the measured acceleration of the vehicle V.

The yaw-rate sensor 763 is operative to output, to the bus 74, a sensor signal indicative of an angular velocity around a vertical axis of the vehicle V as a yaw rate of the vehicle V.

That is, the sensor signals sent from the respective sensors 761, 762, and 763 are output to the vehicle control module 77 and the image processing circuit 79 of the environment monitoring module 75 via the bus 74. The sensor signals sent from the respective sensors 761, 762, and 763 can be input to ECUs installed in the vehicle V, such as an engine ECU. The ECUs can be operative to execute various tasks based on the input sensor signals, and output the executed results of the various tasks to the bus 74. At that time, the vehicle control module 77 and the image processing circuit 79 can receive the executed results of the various tasks via the bus 74.

The vehicle control module 77 is operative to control actuators included in target devices installed in the vehicle V, and is operative to control each of the actuators, thus controlling a corresponding one of the target devices based on the sensor signals sent from the respective sensors 761, 762, and 763. The target devices to be controlled include at least three types of devices included in a body system, a power-train system, and a chassis system of the vehicle V.

For example, the target devices include a steering device 771, a brake 772, a motive power generator 773, an automotive transmission 774, headlights 775, directional indicators 776, and windshield wipers 777.

The steering device 771 is operative to assist the driver's steering of the steering wheel of the vehicle V. The brake 772 is operative to slow down the vehicle V. The motive power generator 773 consists of, for example, an internal combustion engine and/or a motor, and is operative to generate motive power for travelling the vehicle V. The automotive transmission 774 is operative to convert a rotational speed and torque as the motive power generated by the motive power generator 773 into an adjusted rotational speed and adjusted torque, and supply the adjusted rotational speed and adjusted torque to driving wheels of the vehicle V.

The headlights 775 are operative to light up the road on which the vehicle V is travelling. Each of the directional indicators 776 is operative to flash when the vehicle V is about to turn in a corresponding direction, i.e. right or left, or to make a corresponding lane change. The windshield wipers 777 are operative to clean the respective front windshield 102 and rear windshield from rain, snow, or other moisture.

Note that the vehicle control module 77 includes ECUs 778 for controlling actuators installed in the vehicle V; the ECUs 778 include the headlight control ECU 778a and the lane departure detection ECU 778b.

The HMI module 78 is operative to provide interfaces between occupants in the vehicle V and the vehicle V. For example, the HMI module 78 includes a buzzer 781, a speaker 782, at least one indicator 783, at least one display 784, and actuators of the respective devices 781 to 784 installed in the vehicle V. The buzzer 781 is operative to output a warning sound, and the speaker 782 is operative to output audible information. The indicator 783 is operative to generating a light signal, and the at least one display 784 includes a navigation display and/or a head-up display installed in a center console of the vehicle V.

In addition, the HMI module 78 can include at least one vibration device and at least one reaction force generator (not shown). The at least one vibration device is comprised of a motor for generating vibrations of at least one of the steering wheel of the vehicle V and one or more seats of the vehicle V. The at least one reaction force generator is operative to generate reaction force to be supplied to at least one of the steering wheel of the vehicle V and a brake pedal of the vehicle V.

Specifically, the HMI module 78 is operative to activate at least one of these devices included therein to offer information to occupants of the vehicle V.

The HMI module 78 can include an adjusting unit that allows an occupant to input a desired level of recognition for a recognition task described later and/or a timing to start a determining task described later, thus transferring information from an occupant to the vehicle V.

The I/O circuit 80 is designed as a circuit included in various circuits implemented on and/or in the control circuit board 4, and operative to allow communications among the various circuits implemented in and/or on the control circuit board 4.

The image processing circuit 79 is designed as a circuit, such as an IC chip, included in the various circuits implemented on and/or in the control circuit board 4. The image processing circuit 79 is operative to perform the recognition task to recognize the environmental conditions around the vehicle V based on images picked up by the imaging device 1 and/or the other cameras and the object information measured by and sent from the radar device 752.

Figure 7:
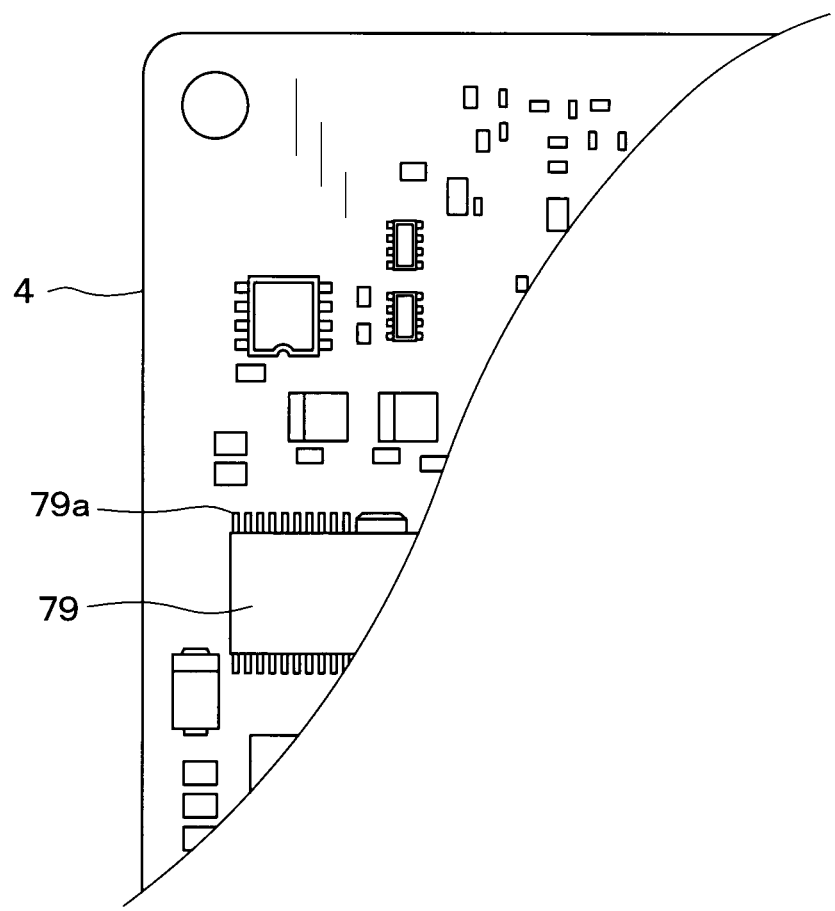
FIG. 7 is a view schematically illustrating a part of an image processing circuit implemented on a control circuit board of the imaging device.

The image processing circuit 79 is composed of, for example, an electronic circuit device, which contains 3.3 V signal lines, and is driven based on 3.3 V. For this reason, the image processing circuit 79 has lower power consumption and a lower heating value. Referring to FIG. 7, the image processing circuit 79 has for example external terminals 79a with 1.27 mm or lower pitches. This configuration of the image processing circuit 79 contributes to reduction of the image processing circuit 79 and the control circuit board 4 in size. Note that, as illustrated in FIG. 4, if the image processing circuit 79 consists of a single device, i.e. a single IC chip, the device preferably has external terminals with 1.27 mm or lower pitches. However, if the image processing circuit 79 consists of a plurality of devices, i.e. IC chips, at least one of the devices preferably has external terminals with 1.27 mm or lower pitches.

Figure 8:
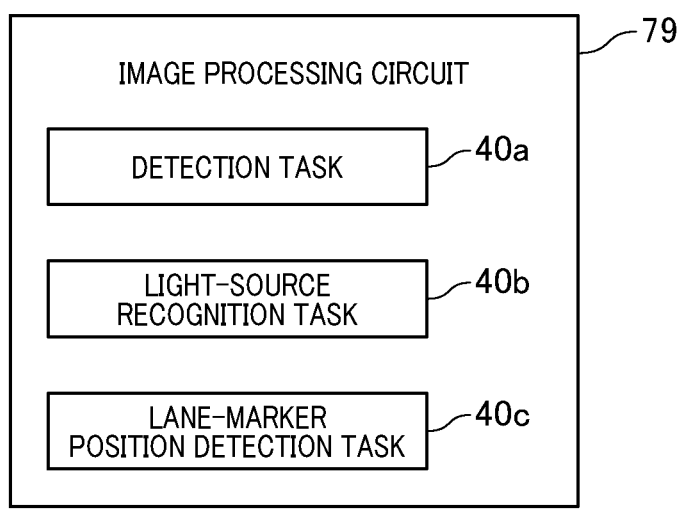
FIG. 8 is a block diagram schematically illustrating an example of the functional structure of the image processing circuit illustrated in FIG. 7.

Referring to FIG. 8, the image processing circuit 79 successively, i.e. cyclically, captures images successively picked up by the image sensor 33a of the camera module 3, and performs, for each of the captured images, a detection task 40a, a light-source recognition task 40b, and a lane-marker position detection task 40c as examples of image-recognition tasks.

The image processing circuit 79 performs the detection task 40a that determines whether there is at least one light source of a vehicle appearing in each of the captured images. Specifically, the image processing circuit 79 determines that there is at least one light source of a vehicle appearing in a currently captured image; the at least one region has at least one of (1) An average pixel value equal to or higher than a threshold pixel value (2) A shape similar to one of previously prepared shape patterns (3) An average color is similar to one of previously prepared color patterns.

When it is determined that there is at least one light source appearing in a currently captured image, the image processing circuit 79 identifies a position of the at least one light source on the currently captured image as coordinates on the currently captured image.

Next, the image processing circuit 79 performs the light-source recognition task 40b that determines whether the at least one light source is a light source, i.e. a tail lamp, of a preceding vehicle or a light source, i.e. a head lamp, of an oncoming vehicle using, for example, one of known methods. For example, the light-source recognition task 40b is designed to determine that the at least one light source is a light source of an oncoming vehicle when the average color of the at least one light source is within a predetermined color range similar to white. Otherwise, for example, the light-source recognition task 40b is designed to determine that the at least one light source is a light source of a preceding vehicle when the average color of the at least one light source is within a predetermined color range similar to red. Thus, the light-source recognition task obtains information indicative of whether the at least one light source is a light source of a preceding vehicle or an oncoming vehicle.

Then, the image processing circuit 79 outputs, to the headlight control ECU 778a via the bus 74, the coordinates of the at least one light source appearing in a currently captured image and the obtained information as camera information in the form of signals. The camera information represents an example of the results of one or more image-recognition tasks.

Note that the image processing circuit 79 is not limited to outputting camera information each time it is determined that there is at least one light source of a vehicle appearing in a currently captured image. Specifically, the image processing circuit 79 can be configured to determine whether the image processing circuit 79 should output camera information to the headlight control ECU 778a based on information included in the sensor signals sent from the respective sensors 761, 762, and 763. The image processing circuit 79 can be configured to output camera information to the headlight control ECU 778a when it is determined that the image processing circuit 79 should output camera information to the headlight control ECU 778a. Otherwise, the image processing circuit 79 can be configured not to output camera information to the headlight ECU 778a when it is determined that the image processing circuit 79 should not output camera information to the headlight control ECU 778a.

The information used by the determination of whether the image processing circuit 79 should output camera information to the headlight control ECU 778a is included in the sensor signals sent from the respective sensors 761, 762, and 763 to the bus 74, which is referred to as vehicle sensor information, but the present disclosure is not limited thereto. Specifically, the sensor signals sent from the respective sensors 761, 762, and 763 via the bus 74 can be processed by another ECU, and thereafter, the processed sensor signals can be output to the image processing circuit 79. Then, the image processing circuit 79 uses, as the vehicle sensor information, information included in the processed sensor signals.

Specifically, the image processing circuit 79 obtains, from the vehicle sensor information, values of vehicle behavior parameters, such as the speed of the vehicle V, the acceleration of the vehicle V, and the yaw-rate of the vehicle V. Then, the image processing circuit 79 determines whether the obtained values of the vehicle behavior parameters are within respective first threshold ranges. Specifically, the image processing circuit 79 determines whether (1) The obtained value of the vehicle speed is equal to or lower than a predetermined first threshold speed (2) An absolute value of the obtained acceleration is equal to or lower than a predetermined first threshold value (3) The obtained value of the yaw-rate is equal to or lower than a predetermined first threshold rate.

Let us consider a first case where the obtained values of the vehicle behavior parameters are beyond the respective first threshold ranges. In other words, let us consider a first case where the obtained value of the vehicle speed is higher than the first threshold speed, the absolute value of the obtained acceleration is higher than the first threshold value, and the obtained value of the yaw-rate is higher than the first threshold rate.

In the first case, the image processing circuit 79 determines that the image processing circuit 79 should output camera information to the headlight control ECU 778a.

Otherwise, let us consider a second case where the obtained values of the vehicle behavior parameters are within the respective first threshold ranges. In other words, let us consider a second case where the obtained value of the vehicle speed is equal to or lower than the first threshold speed, the absolute value of the obtained acceleration is equal to or lower than the first threshold value, and the obtained value of the yaw-rate is higher than the first threshold rate. In the second case, the image processing circuit 79 determines that the image processing circuit 79 should not output camera information to the headlight control ECU 778a.

When receiving the camera information sent from the image processing circuit 79 and the sensor signals sent from the respective sensors 761 to 763, the headlight control ECU 778a is configured to (1) Send, to first actuators of the respective headlights via the bus 74, control signals for changing the beams of light output from the respective headlights 775 between high and low beams (2) Send, to second actuators of the respective headlights via the bus 74, control signals for swiveling the axes of the beams of light output from the respective headlights 775 in the lateral direction of the vehicle V.

As described above, the headlight control ECU 778a uses the camera information for controlling the first and second actuators. In other words, the camera information serves as signals to control the first and second actuators.

In addition, the image processing circuit 79 performs, as the lane-marker detection task 40c, a known lane-marker detection task for each of the captured images. For example, the image processing circuit 79 detects, for each of the captured images, positions of lane markers painted on the road ahead of the vehicle V on which the vehicle V is travelling using a binarizing process of a corresponding one of the captured images and a Hough transformation process. Then, the image processing circuit 79 outputs, to the lane departure detection ECU 778b via the bus 74, the positions of the lane markers as lane-marker position information.

Note that the image processing circuit 79 is not limited to outputting lane-marker position information each time the image processing circuit 79 captures an image output from the image sensor 33a.

Specifically, the image processing circuit 79 can be configured to determine whether the image processing circuit 79 should output lane-marker position information to the lane departure detection ECU 778b based on the vehicle sensor information included in the sensor signals sent from the respective sensors 761, 762, and 763. The image processing circuit 79 can be configured to output lane-marker position information to the lane departure detection ECU 778b when it is determined that the image processing circuit 79 should output lane-marker position information the lane departure detection ECU 778b. Otherwise, the image processing circuit 79 can be configured not to output lane-marker detection information to the lane departure detection ECU 778b when it is determined that the image processing circuit 79 should not output lane-marker detection information to the lane departure detection ECU 778b.

The vehicle sensor information used by the determination of whether the image processing circuit 79 should output lane-marker detection information to the lane departure detection ECU 778b is included in the sensor signals sent from the respective sensors 761, 762, and 763 to the bus 74, but the present disclosure is not limited thereto. Specifically, the sensor signals sent from the respective sensors 761, 762, and 763 via the bus 74 can be processed by another ECU, and thereafter, the processed sensor signals can be output sent to the headlight ECU 778a. Then, the image processing circuit 79 uses, as the vehicle sensor information, information included in the processed sensor signals.

Specifically, the image processing circuit 79 obtains, from the vehicle sensor information, values of the vehicle behavior parameters, such as the speed of the vehicle V, the acceleration of the vehicle V, and the yaw-rate of the vehicle V. Then, the image processing circuit 79 determines whether the obtained values of the vehicle behavior parameters are within respective second threshold ranges that can be equal to or different from the respective first threshold ranges. Specifically, the image processing circuit 79 determines whether (1) The obtained value of the vehicle speed is equal to or lower than a predetermined second threshold speed (2) An absolute value of the obtained acceleration is equal to or lower than a predetermined second threshold value (3) The obtained value of the yaw-rate is equal to or lower than a predetermined second threshold rate.

Let us consider a first case where the obtained values of the vehicle behavior parameters are beyond the respective second threshold ranges. In other words, let us consider a first case where the obtained value of the vehicle speed is higher than the second threshold speed, the absolute value of the obtained acceleration is higher than the second threshold value, and the obtained value of the yaw-rate is higher than the second threshold rate.

In the first case, the image processing circuit 79 determines that the image processing circuit 79 should output lane-marker detection information to the lane departure detection ECU 778b.

Otherwise, let us consider a second case where the obtained values of the vehicle behavior parameters are within the respective second threshold ranges. In other words, let us consider a second case where the obtained value of the vehicle speed is equal to or lower than the second threshold speed, the absolute value of the obtained acceleration is equal to or lower than the second threshold value, and the obtained value of the yaw-rate is higher than the second threshold rate. In the second case, the image processing circuit 79 determines that the image processing circuit 79 should not output lane-marker detection information to the lane departure detection ECU 778b.

When receiving the lane-marker detection information sent from the image processing circuit 79 and the sensor signals sent from the respective sensors 761 to 763, the lane departure detection ECU 778b is configured to determine whether (1) A probability of the vehicle V unintentionally leaving, i.e. departing from, a lane on which the vehicle V is running is higher than a threshold probability or (2) The vehicle V has unintentionally left a lane on which the vehicle V was running.

The lane departure detection ECU 778b controls a corresponding actuator of at least one of the warning devices 781 to 784 to activate it when it is determined that (1) The probability of the vehicle V unintentionally leaving the lane on which the vehicle V is running is higher than the threshold probability or (2) The vehicle V has unintentionally left the lane on which the vehicle V was running.

The at least one of the warning devices 781 to 784 is activated to output warning information for the occupants of the vehicle V.

The lane departure detection ECU 778b can send a control signal to the actuator of the steering device 771 to adjust the steering angle of the steering wheel when it is determined that (1) The probability of the vehicle V unintentionally leaving the lane on which the vehicle V is running is higher than the threshold probability or (2) The vehicle V has unintentionally left the lane on which the vehicle V was running.

The adjustment of the steering angle of the steering wheel prevents the vehicle V from unintentionally leaving the lane or returns the vehicle V, which unintentionally left the lane, to the lane.

As described above, the lane departure detection ECU 778b uses the lane-marker detection information for controlling the actuators of at least one of the warning devices 781 to 784 and the steering device 771. In other words, the lane-marker detection information serves as signals to control the actuators of the one or more warning devices 781 to 784 and the steering device 771 installed in the vehicle V.

As described above, the image processing circuit 79 successively captures images successively sent from the image sensor 33a, and obtains the sensor signals sent from the respective sensors 761 to 763 via the bus 74. Then, the image processing circuit 79 performs various tasks including the tasks 40a to 40c set forth above, based on the captured images and the sensor signals. Based on the results of the various tasks and the sensor signals, the image processing circuit 79 outputs control signals to at least one of the actuators of target devices to be controlled by at least one of the vehicle control module 77 and the HMI module 78.

Next, the following describes the structure of the camera module 3 and how the camera module 3 is mounted to the housing 2 according to the first embodiment in detail with reference to FIGS. 9 to 14.

Figure 9:
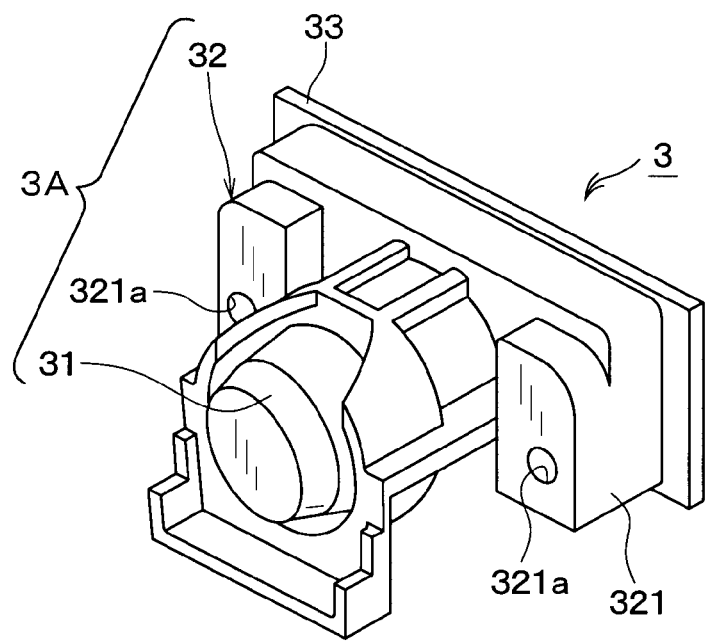
FIG. 9 is a perspective view of a camera module of the imaging device illustrated in FIG. 1.
Figure 10:
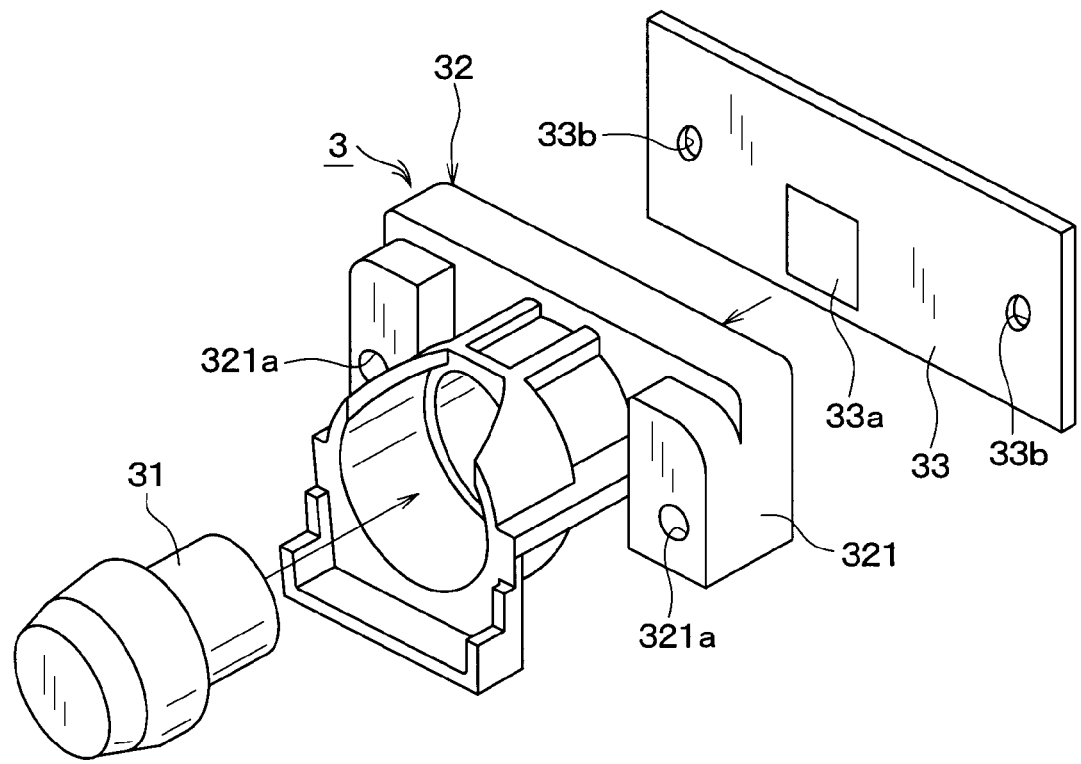
FIG. 10 is an exploded perspective view of the camera module illustrated in FIG. 9.
Figure 13:
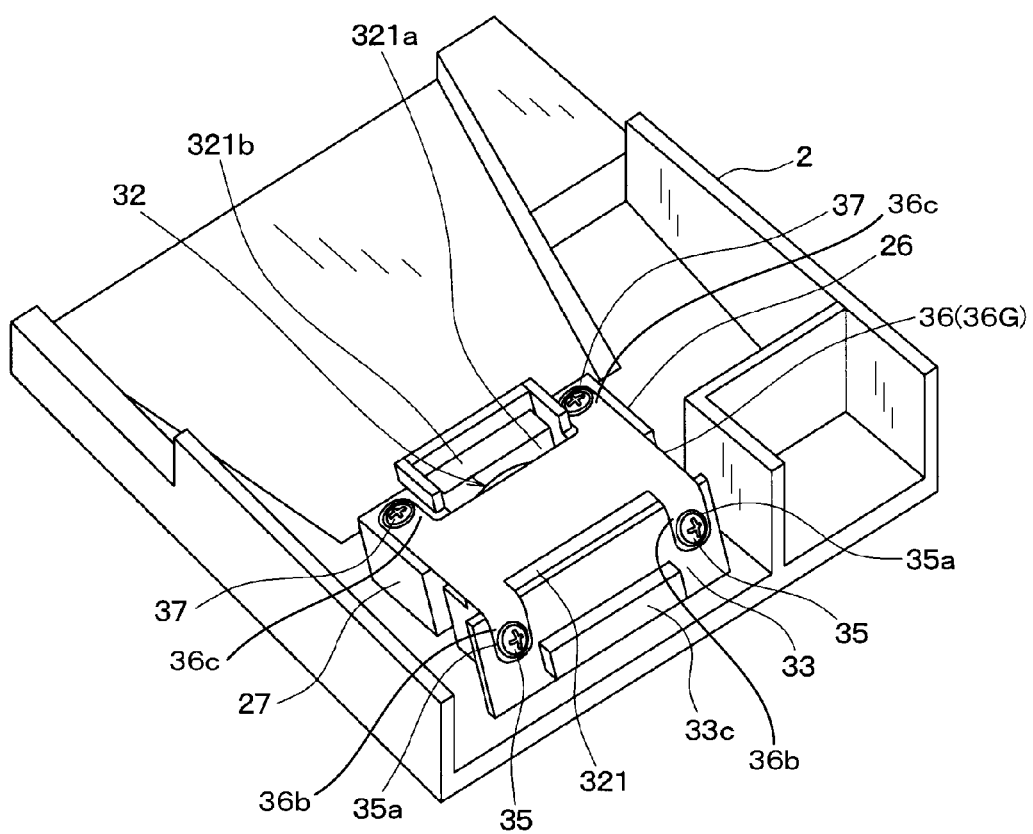
FIG. 13 is a perspective view schematically illustrating the inside of the housing illustrated in FIG. 1 after the camera module and a heat dissipator plate are installed in the housing.
Figure 14:
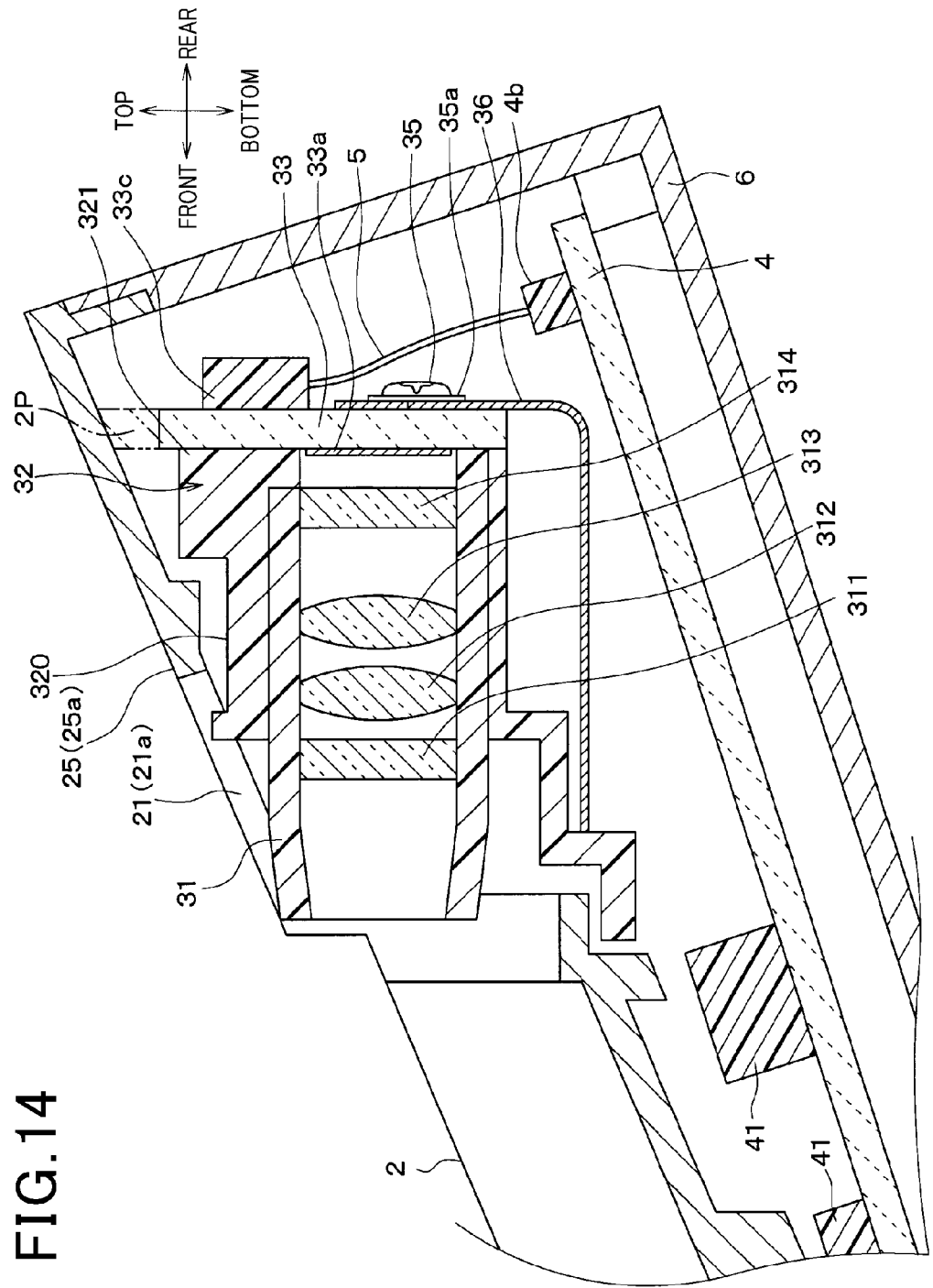
FIG. 14 is a cross sectional view taken along line XIV-XIV of FIG. 2B.

Referring to FIGS. 9 and 10, the camera module 3 includes the lens assembly 3A. The lens assembly 3A is comprised of a lens barrel 31 including a plurality of lenses, and a lens holder 32. The camera module 3 also includes a camera board, i.e. an image-sensor board, 33 and a heat dissipator plate, i.e. a thermal-transfer plate, 36. As illustrated in FIGS. 13 and 14, the camera module 3 is configured such that heat generated from the image sensor 33a is transferred to the housing 2 via a heat dissipation path including the heat dissipator plate 36. The heat dissipator plate 36 will be referred to simply as a dissipator plate 36.

The lens barrel 31 includes a tubular body 31a made of, for example, a resin in which the plurality of lenses (for example, 311 to 314 illustrated in FIG. 13) are disposed to be coaxially aligned with each other.

The lens holder 32 is made of, for example, a resin, and holds the lens barrel 31 to thereby hold the plurality of lenses 311 to 314. The lens barrel 31 can be integrally formed with the lens holder 32, so that the lens holder 32 directly holds the plurality of lenses 311 to 314.

The lens holder 32 has a substantially plate-like base 32a constituting a second air-passage defining structure described later. The base 32a is arranged such that its major surfaces are directed to the front and rear directions of the vehicle V. The lens holder 32 also has a tubular holding body 320 attached to one major surface, i.e. a front surface, of the base 32a such that a center axis of the tubular holding body 320 extends along the front-rear direction of the vehicle V. The tubular holding body 320 holds the lens barrel 31 such that the optical axes 310 of the lenses 311 to 314 are aligned with the center axis thereof.

The camera board 33 has one major surface, i.e. a front surface, on which the image sensor 33a is mounted, and the other major surface, i.e. a rear surface, opposite to the front surface. The image sensor 33a is operative to pick up images of a region ahead of the vehicle V. The camera board 33 is fixedly attached to the other major surface, i.e. the rear surface, of the base 32a such that the center of the image sensor 33a is located through which the optical axis 310 of the lenses 311 to 314 passes. The camera module 3 is installed in the housing 2 such that the camera board 33 faces the opening 21 of the housing 2.

The dissipator plate 36 serves as a heat transfer member. The dissipator plate 36 is made of, for example, high thermal-conductive metal. The dissipator plate 36 is arranged to transfer heat from the camera board 33 to the housing 2. For example, the dissipator plate 36 is disposed to be in contact with the camera board 33. The camera board 33 can be arranged to directly transfer heat produced from the image sensor 33a to the housing 2 or to transfer heat produced from the image sensor 33a via the dissipator plate 36 according to the first embodiment.

Figure 11:
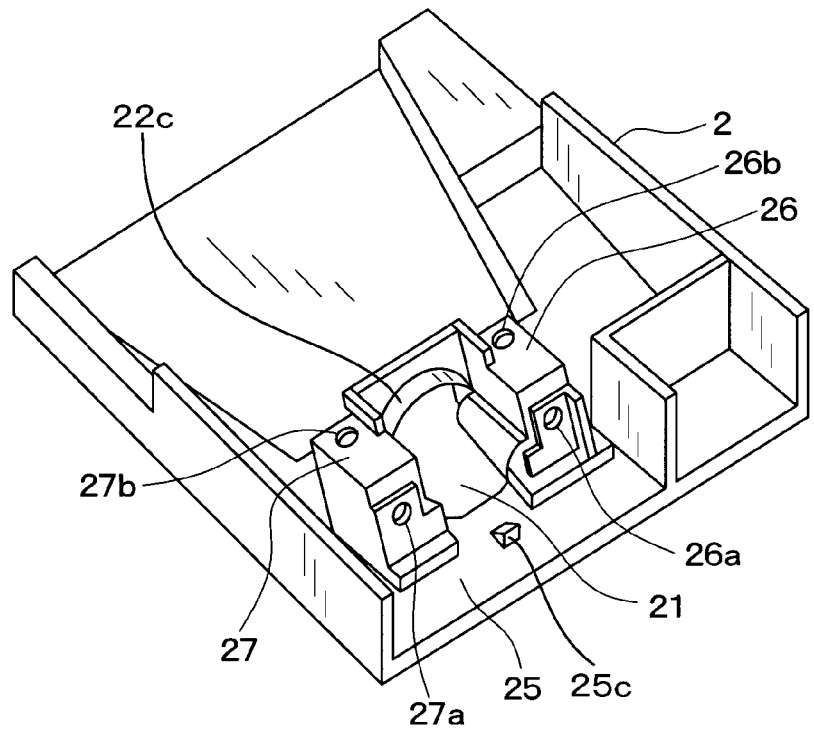
FIG. 11 is a perspective view schematically illustrating the inside of a housing illustrated in FIG. 1 before the camera module is installed in the housing.
Figure 12:
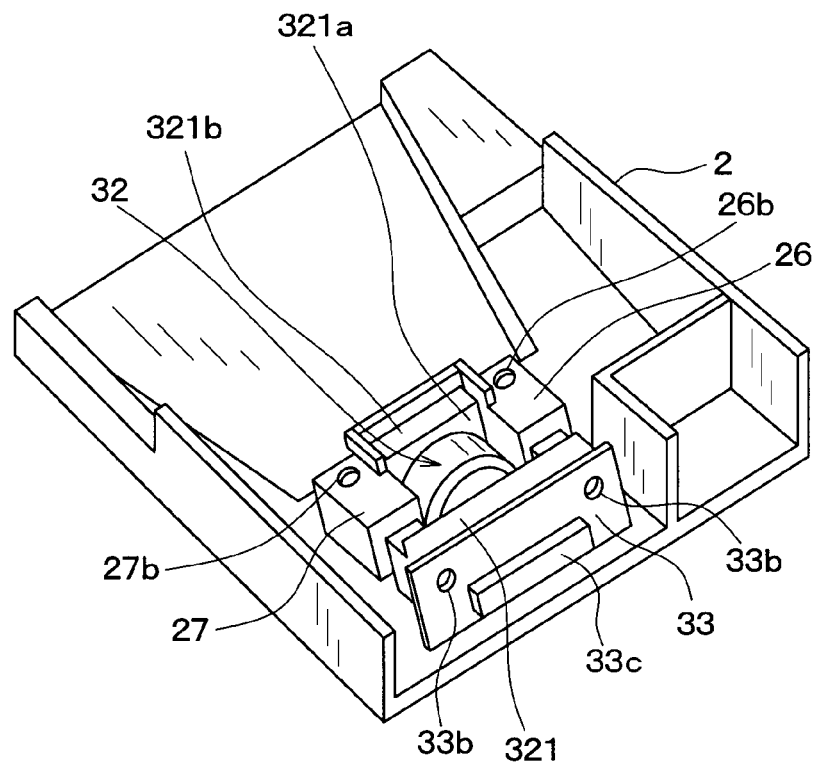
FIG. 12 is a perspective view schematically illustrating the inside of the housing illustrated in FIG. 1 after the camera module is installed in the housing.

Specifically, referring to FIG. 11, the left-hand end 26 of the attachment wall 25 has a surface on which the camera board 33 is mounted, and the surface of the left-hand end 26 has an internally threaded groove 26a. Similarly, the right-hand end 27 of the attachment wall 25 has a surface on which the camera board 33 is mounted, and the surface of the right-hand end 27 has an internally threaded groove 27a. Referring to FIGS. 10 and 12, the lens holder 32 has a support 321 mounted on the front surface of the base 32a at both sides of the tubular holding body 320. The support 321 has a predetermined width in the longitudinal direction of the vehicle V. The support 321 has an internally threaded hole 321a formed therethrough and arranged to align with a corresponding one of the internally threaded grooves 26a and 27a. The base 32a of the lens holder 32 has internally threaded holes 33b arranged to align with the respective internally threaded grooves 26a and 27a. An externally threaded screw 35, which has a head and an externally threaded portion, is fitted through a washer 35a, the internally threaded holes 33b and 321a in the internally threaded groove 26a. This enables the externally threaded portion of the externally threaded screw 35 to be engaged with the internally threaded holes 33b and 321a and the internally threaded groove 26a. Similarly, an externally threaded screw 35, which has a head and an externally threaded portion, is fitted through a washer 35a, the internally threaded holes 33b and 321a in the internally threaded groove 27a. This enables the externally threaded portion of the externally threaded screw 35 to be engaged with the internally threaded holes 33b and 321a and the internally threaded groove 27a. This results in the camera board 33 and the lens holder 32 being fastened to the housing 2.

Referring to FIGS. 11 and 13, the dissipator plate 36 has a rectangular portion 36a and a first end portion 36b projecting from each edge of the rear end of the rectangular portion 36a. Specifically, each of the first end portion 36b is folded to be substantially vertical to the rectangular portion 36a. Each of the left-hand and right-hand ends 26 and 27 of the attachment wall 25 has a bottom surface on which the rectangular portion 36a of the dissipator plate 36 is mounted. Specifically, each of the first end portions 36b projects from the corresponding edge of the rear end of the rectangular portion 36a such that a projecting end thereof is filled between a corresponding one of the washers 35a and the camera board 33. This enables the dissipator plate 36 to be fastened to the housing 2 together with the camera board 33 and the lens holder 32.

The bottom surface of the left-hand end 26 has an internally threaded groove 26b, and the bottom surface of the right-hand end 27 has an internally threaded groove 27b.

The rectangular portion 36a of the dissipator plate 36 also has second end portions 36c, which are opposite to the first end portions 36b. Each of the second end portions 36c projects forwardly from a corresponding one of the edges of the front end of the rectangular portion 36a. A projecting edge of each of the second end portions 36c has a through or an internally threaded hole, and is mounted on a corresponding one of the internally threaded grooves 26b and 27b such that the through or internally threaded hole is aligned with a corresponding one of the internally threaded grooves 26b and 27b.

An externally threaded screw 37, which has a head and an externally threaded portion, is fitted through the through or internally threaded hole of one of the second end portions 36c in the internally threaded groove 26b. This enables the externally threaded portion of the externally threaded screw 37 to be engaged with the internally threaded groove 26b. Similarly, an externally threaded screw 37, which has a head and an externally threaded portion, is fitted through the through or internally threaded hole of the other of the second end portions 36c in the internally threaded groove 27b. This enables the externally threaded portion of the externally threaded screw 37 to be engaged with the internally threaded groove 27b. This enables the dissipator plate 36 to be fastened to the housing 2.

The dissipator plate 36 is specially configured to reduce the generation of radiation noise while maintaining high heat dissipation. The detailed structure of the dissipator plate 36 will be described later.

A two-dimensional CMOS image sensor comprised of CMOS semiconductor elements, i.e. semiconductor cells, arranged in a two-dimensional array or a two-dimensional CCD image sensor comprised of semiconductor elements, i.e. photodiodes, arranged in a two-dimensional array can be used as the image sensor 33a. Each semiconductor element of the image sensor 33a is operative to receive light and generate an electrical signal whose level matches with the intensity of the received light. That is, the image sensor 33a is operative to generate the electrical signals matching with an image ahead of the vehicle V. As described above, the image sensor 33a can serve as both a heat source and a noise source.

The camera board 33 is fixedly attached to the other major surface, i.e. the rear surface, of the base 32a such that the center of the image sensor 33a is located through which the optical axis 310 of the lenses 311 to 314 passes. The camera module 3 is installed in the housing 2 such that the camera board 33 faces the opening 21 of the housing 2. The image sensor 33a is electrically connected to wiring patterns formed to the camera board 33a.

The electrical connection harness 5 illustrated in FIG. 3 serves as a electrical connection members that electrically connect the image sensor 33a and the other circuits on the camera board 33 to the image processing circuit 79 and other circuits implemented to the control circuit board 4.

Note that the electrical connection harness 5 is for example designed as a wiring board, such as a flexible printed wiring board, and wires printed on the wiring board connect the image sensor 33a and other elements implemented on the camera board 33 to the circuits including the image processing circuit 79 and implemented on the control circuit substrate 4.

Referring to FIG. 9, the tubular holder body 320 has an upper semi-tubular wall 320a mounted on the front surface of the base 32a and having an opening 320b in which one end, i.e. a rear-side end, of the lens barrel 31 is fitted. The tubular holder body 320 also has a surrounding wall 320c having a substantially C shape with both upper ends spaced apart. The surrounding wall 320c extends integrally from the annular periphery of the upper semi-tubular wall 320a in the front direction of the vehicle V, and surrounds the other end, i.e. a front-side end, of the lens barrel 31.

Referring to FIG. 14, a connector 4b is mounted to the control circuit board 4 in addition to the image processing circuit 79 comprised of electronic components 41 including, for example, an image processor. The connector 4b is electrically connected to the image processing circuit 79 via the wiring patterns mounted to the control circuit board 4.

As illustrated in FIGS. 12 to 14, a connector 33c is mounted on the rear surface of the camera board 33. The electrical connection harness 5 has terminals at both ends thereof, and the terminals of the electrical connection harness 5 at one end thereof are fitted in the connector 4b so that electrical connections between the connector 4b and the electrical connection harness 5 are established. Similarly, the terminals of the electrical connection harness 5 at the other end thereof are fitted in the connector 33c so that electrical connections between the connector 33c and the electrical connection harness 5 are established. The above configuration enables images picked up by the image sensor 33a to be sent to the image processing circuit 79 via the camera board 33 and the electrical connection harness 5.

The first end portions 36b of the dissipator plate 36 are fixed to the rear surface of the camera board 33, and the second end portions 36c thereof are fixed to the housing 2. This enables heat generated from the image sensor 33a to be transferred from the dissipator plate 36 to the housing 2, resulting in external dissipation of the heat from the housing 2.

The control circuit board 4, to which the camera module 3 including the image sensor 33a, and the image processing circuit 79 are covered with the housing 2 and the bottom cover 6; the assembly of the housing 2 and the bottom cover 6 serves as the case of the imaging device 1. This prevents noise present in the signals output from the image sensor 33a and the image processing circuit 79 from being externally irradiated as radiation noise as illustrated by the dashed arrow illustrated in FIG. 15.

Additionally, the camera board 33 according to the first embodiment is configured to both (1) Electrically connect between the image sensor 33a and the image processing circuit 79 therethrough (2) Reduce generation of radiation noise caused by the signal paths between the image sensor 33a and the image processing circuit 79 via the camera board 33, the dissipator plate 36, and the housing 2.

Figure 15:
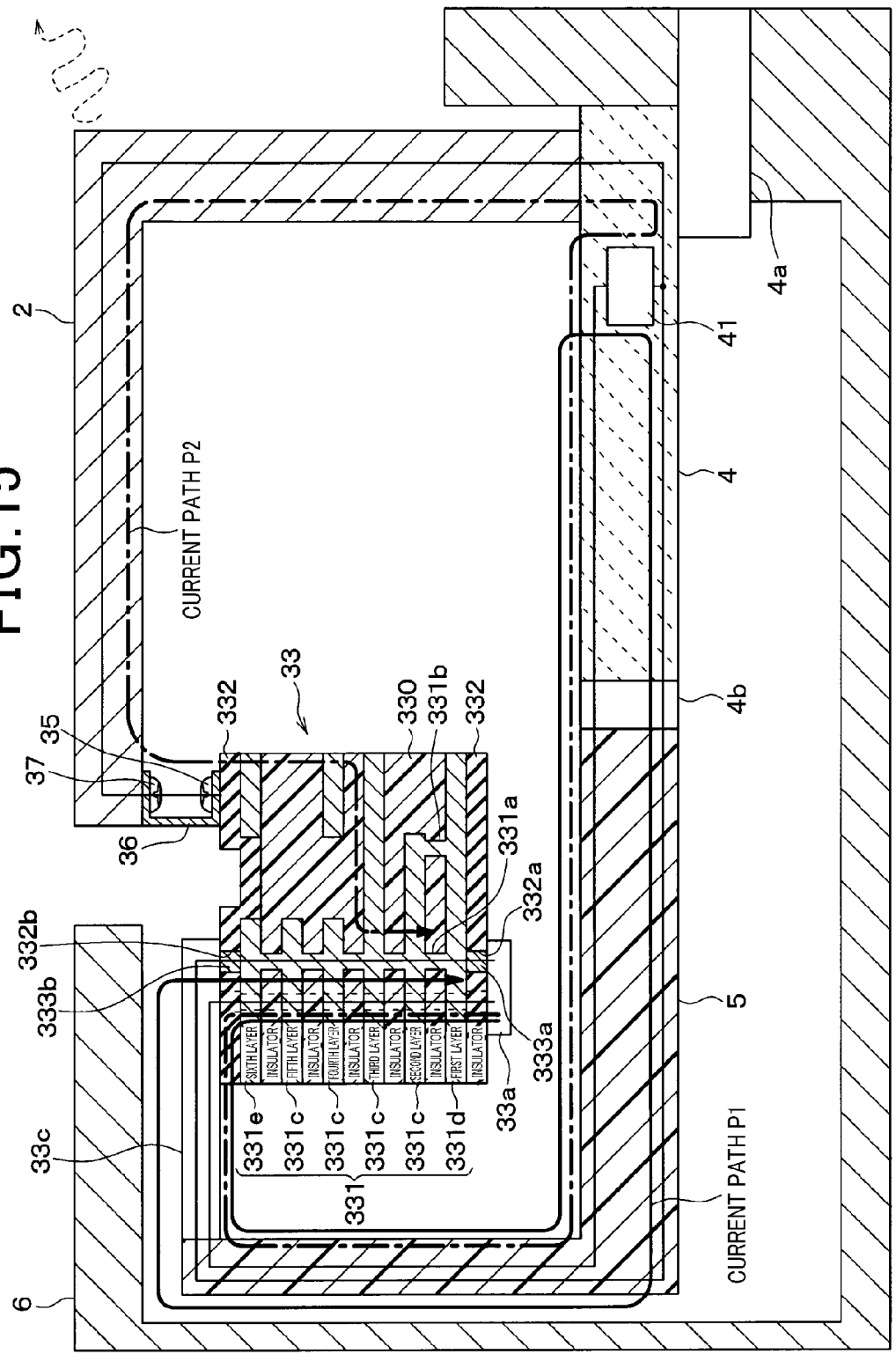
FIG. 15 is a cross sectional view schematically illustrating an example of the detailed structure of a camera board of the camera module according to the first embodiment.
Figure 16:
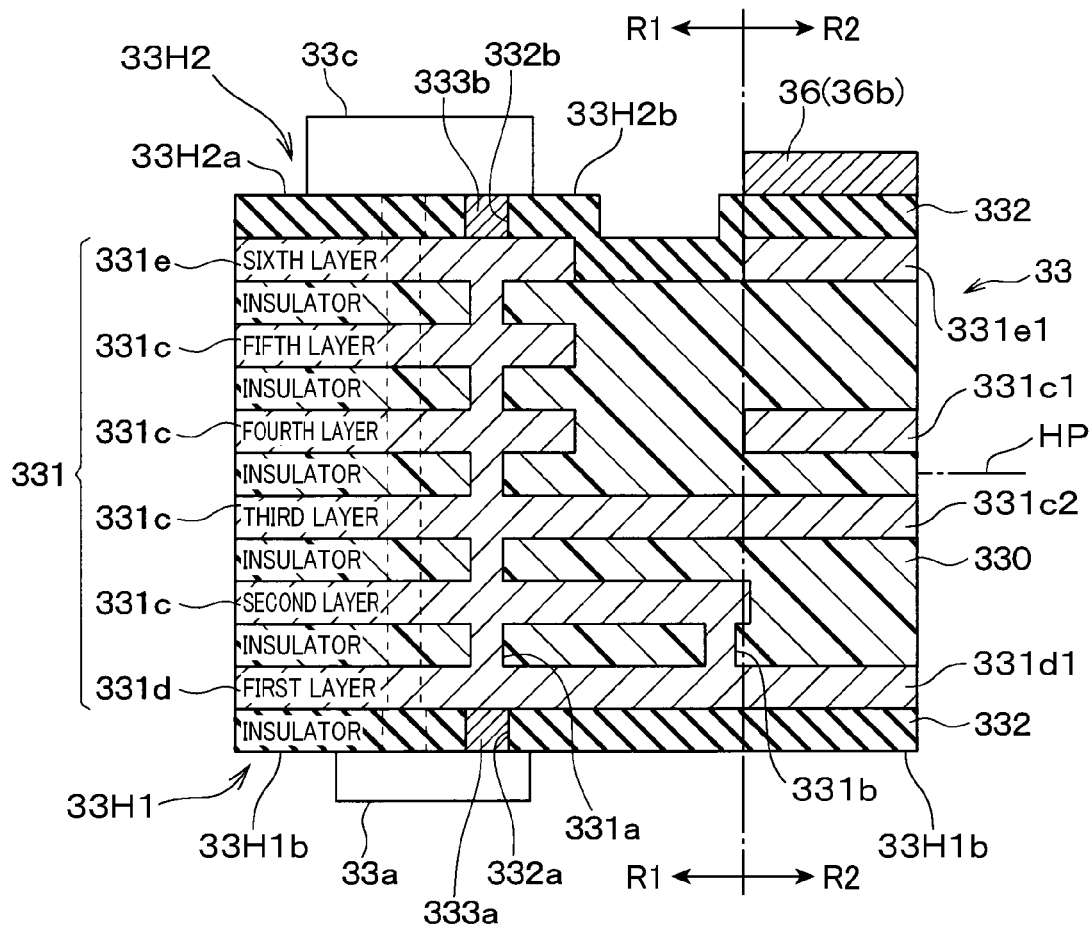
FIG. 16 is a vertical cross sectional view of the camera board according to the first embodiment.

The following describes the detailed structure of the camera board 33 with reference to FIGS. 15 and 16. Note that, in order to easily understand the detailed structure of the camera board 33 and the electrical connections among the housing 2, the camera board 33, the electrical connection harness 5, the control circuit board 4, and the bottom cover 6, the cross sectional view of the imaging device 1 illustrated in FIG. 15 is slightly different from the cross sectional view of the imaging device 1 illustrated in FIG. 14.

Referring to FIG. 15, the camera board 33 works to establish (1) Electrical connections between image sensor 33a and the electrical connection harness 5

(2) Connection of the image sensor 33a to the housing 2

(3) Heat dissipation to the housing 2.

The connector 33c of the camera board 33 enables electrical connections between the camera board 33 and the electrical connection harness 5. This results in the image sensor 33a being electrically connected to the electronic components 41 of the image processing circuit 79 mounted to the control circuit board 4 via the camera board 33 and the electrical connection harness 5.

The dissipator plate 36 is mounted to the portion of the camera board 33; the mount portion of the dissipator plate 36 differs from the mount portion of the connector 33c. The dissipator plate 36 and the camera board 33 are fastened to each other with the screws 35, so that the dissipator plate 36 is also fastened to the housing 2 with the screws 35. Additionally, the second end portions 36c of the dissipator plate 36 are fastened to the housing 2 with the screws 37. This configuration therefore enables heat generated from the image sensor 33a to be transferred to the housing 2 via the camera board 33 and the dissipator plate 36.

An electrical path P1 among the image sensor 33a and the electronic components 41 via the camera board 33 and the electrical connection harness 5 is needed for both transfer of signals, i.e. currents, which include information about the picked-up images, from the image sensor 33a to the electronic components 41, and for the flow of return currents. Even if the currents flow through the current path P1, the housing 2 and the bottom cover 6, which cover the current path P1, prevent noise present in the currents from being irradiated as radiation noise to the outside of the housing 2 and the bottom cover 6.

The camera board 33 is joined to the housing 2 via the dissipator plate 36, and the housing 2 is joined to the control circuit board 4. This might cause a current path P2 to be formed If such a current path P2 were formed, signals might be transferred to the housing 2, which is exposed on the outside of the imaging device 1, via the current path P2. This might result in noise present in the signals being irradiated to the outside of the imaging device 1. From this viewpoint, the camera board 33 is specially configured to prevent currents from flowing through the electrical path P2 while improving dissipation efficiency of heat generated from the image sensor 33a.

FIG. 16 illustrates that the camera board 33 includes a plurality of insulators 330 made of, for example, resin, and a plurality of conductor patterns, i.e. conductor patterns, 331 made of a material higher in thermal conductivity than the material of the insulators 330. The first embodiment uses metal, such as copper, as the material of the conductor patterns 331. The insulators 330 and the conductor patterns 331 are alternately laminated to constitute a multilayered circuit board as the camera board 33. Specifically, an insulator 330 is prepared, and a conductor thin film is formed on at least a part of at least one major surface of the insulator 330. Then, previously designed patterning is applied to the conductor thin film of at least one major surface of the insulator 330, so that one conductor pattern 331 is obtained. Two insulators 330, each of which is formed with a conductor film formed on at least a part of at least one major surface thereof, are arranged at both sides of the conductor pattern 331 as built-up layers. The two insulators 330 sandwiching the conductor-pattern layer 331 are pressurized and heated while the sandwiched structure is maintained, so that the two insulators 330 and the conductor pattern 331 are integrally assembled with each other. Previously designed patterning is applied to the conductor thin film mounted on either outer surface of the assembly of the two insulators 330 and the conductor-pattern layer 331, so that a conductor pattern 331 is formed at either outer side of the assembly of the two insulators 330 and the conductor-pattern layer 331. The above arrangement of two insulators 330, pressuring and heating, and patterning are repeated. This produces the assembly of the insulators 330, the inner conductor patterns 331 each sandwiched between corresponding two insulators 330, and the outermost conductor patterns 331. That is, the outermost conductor patterns 331 are located at both outermost surfaces of the assembly.

If necessary, a through via-hole 331a is formed through the assembly to electrically connect the conductor patterns of the conductor-patterned layers 331 to one another, and a blind via-hole 331b is formed in the assembly in the assembly to electrically connect the conductor patterns of some conductor-patterned layers 331 to one another. This obtains the camera substrate 33 comprised of the substrates 330, the inner conductor patterns 331, and the outermost conductor patterns 331.

The inner conductor patterns 331 will be referred to as inner patterned layers 331c, and the outermost conductor patterns 331 will be referred to as outermost conductor patterns 331d and 331e. FIG. 16 illustrates an example of the camera board 33.

Specifically, the camera board 33 illustrated in FIG. 16 includes (1) The outermost patterned layer 331d serving as the first conductor pattern (2) Four inner patterned layers 331c serving as the second to fifth conductor patterns (3) The outermost patterned layer 331e serving as the sixth conductor pattern.

The outer surface of each of the outermost patterned layers 331d and 331e is covered with a solder-resist layer 332. At least one hole 332a is formed through the solder-resist layer 322 formed on the outer surface of the outermost patterned layer 331d. A conductor 333a, such as a solder, is filled in the at least one hole 332a so as to be connected to the outermost patterned layer 331d. The conductor 333a enables the image sensor 33a to electrically connect to at least one of the conductor patterns 331 therethrough.

Similarly, at least one hole 332b is formed through the solder-resist layer 322 formed on the outer surface of the outermost patterned layer 331e. A conductor 333b, such as a solder, is filled in the at least one hole 332b so as to be connected to the outermost patterned layer 331d. The conductor 333b enables electrical terminals of the connector 33c to electrically connect to at least one of the conductor patterns 331 therethrough.

As illustrated in FIG. 16, the camera board 33 has a first outermost surface 33H1 as the outermost surface of the solder-resist layer 322 formed on the outer surface of the outermost patterned layer 331d.

Similarly, the camera board 33 has a second outermost surface 33H2 as the outermost surface of the solder-resist layer 322 formed on the outer surface of the outermost patterned layer 331e.

The first outermost surface 33H1 is portioned into a first region 33H1a on which the image sensor 33a is mounted, and a second region 33H1b on which no image sensor is mounted. The second outermost surface 33H2 is portioned into a first region 33H2a, which is opposite to the first region 33H1a of the first outermost surface 33H1, and a second region 33H2b, which is opposite to the second region 33H1b of the first outermost surface 33H1. The connector 33c is mounted on the first region 33H2a of the second outermost surface 33H2, and one of the first end portions 36b of the dissipator plate 36 is mounted on the second region 33H2b of the second outermost surface 33H2.

That is, the camera board 33 is partitioned into (1) A sensor-arrangement region R1 defined between the first region 33H1a of the first outermost surface 33H1 and the first region 33H2a of the second outermost surface 33H2 of the camera board 33

(2) A dissipator region R2 defined between the second region 33H1b of the first outermost surface 33H1 and the second region 33H2b of the second outermost surface 33H2 of the camera board 33.

FIG. 16 illustrates merely the dissipator region R2 of the camera board 33 for one of the first end portions 36b of the dissipator plate 36 located at the right side of the sensor-arrangement region R1 for the sake of simply illustration of the camera board 33. The dissipator region R2 of the camera board 33 for the other of the first end portions 36b of the dissipator plate 36 at the left side of the connector 33c in FIG. 16 is however actually provided (see FIG. 20).

The above conductors 333a and 333b are disposed in the sensor-arrangement region R1.

As illustrated in FIG. 16, the sensor-arrangement region R1 of the camera board 33 includes the first conductor pattern 331d, the second to fifth conductor patterns 331c, and the sixth conductor pattern 331e. The first to sixth conductor patterns 331d, 331c, and 331e are arranged to face one another via a corresponding one of the substrates 330. The first to sixth conductor patterns 331*d*, 331*c*, and 331*e* are electrically connected to one another via the through via-hole 331*a*. Because the shapes of the conductor patterns of the first to sixth conductor patterns 331*d*, 331*c*, and 331*e* may differ from one another, the first to sixth conductor patterns 331*d*, 331*c*, and 331*e* can be arranged partially not to face one another via a corresponding one of the substrates 330.

As illustrated in FIG. 16, the dissipator region R2 of the camera board 33 does not include conductor patterns corresponding to all the first conductor pattern 331*d*, the second to fifth conductor patterns 331*c*, and the sixth conductor pattern 331*e*. The dissipator region R2 of the camera board 33 includes conductor patterns corresponding to some of the first conductor pattern 331*d*, the second to fifth conductor patterns 331*c*, and the sixth conductor pattern 331*e*.

Specifically, the dissipator region R2 of the camera board 33 includes a conductor pattern 331*e*1, which corresponds to the sixth conductor pattern 331*e*. The conductor pattern 331*e*1 in the dissipator region R2, which is located closest to the dissipator plate 36, is electrically isolated from the corresponding the sixth conductor pattern 331*e* in the sensor-arrangement region R1. The dissipator region R2 of the camera board 33 includes no conductor pattern corresponding to the fifth conductor pattern 331*c*, and a conductor pattern 331*c*1 that is electrically isolated from the corresponding the fourth conductor pattern 331*c* in the sensor-arrangement region R1. The conductor pattern 331*c*1 faces the conductor pattern 331*e*1 via the corresponding insulator 330. The dissipator region R2 of the camera board 33 includes no conductor pattern corresponding to the second conductor pattern 331*c* in the sensor-arrangement region R1.

In contrast, the dissipator region R2 of the camera board 33 includes a conductor pattern 331*c*2, which is located to be sufficiently far from the dissipator plate 36, integrally joined to the corresponding third conductor pattern 331*c* in the sensor-arrangement region R1. The dissipator region R2 of the camera board 33 includes a conductor pattern 331*d*1, which is located to be sufficiently far from the dissipator plate 36, integrally joined to the corresponding first conductor pattern 331*d* in the sensor-arrangement region R1.

The conductor patterns 331*e*1, 331*c*1, 331*c*2, and 331*d*1 are arranged to at least partly face one another via the corresponding insulator 330.

As described above, at least part of the conductor patterns, i.e. the conductor patterns, 331*e*1, 331*c*1, 331*c*2, and 331*d*1 is joined to a corresponding one of the conductor patterns 331*e*, 331*c*, 331*c*, and 331*d*. This enables heat to be more transferable to the dissipator plate 36 via the at least part of the conductor patterns 331*e*1, 331*c*1, 331*c*2, and 331*d*1; the conductor patterns 331*e*1, 331*c*1, 331*c*2, and 331*d*1 have a higher thermal conductivity than the insulator 330 does.

In addition, one of the conductor patterns 331*e*1, 331*c*1, 331*c*2, and 331*d*1, which is located closest to the dissipator plate 36, is electrically isolated from the conductor patterns 331 in the sensor-arrangement region R1. This eliminates the occurrence of the current path P2 between the housing 2 and the control circuit board 4. This prevents currents from flowing between the image sensor 33*a* and the electronic components 41 including, for example, an image processor.

The conductor patterns 331*e*1, 331*c*1, 331*c*2, and 331*d*1 in the dissipator region R2 are arranged to at least partly face one another via the corresponding insulator 330. This enables heat to be more transferable among the conductor patterns 331*e*1, 331*c*1, 331*c*2, and 331*d*1 in the dissipator region R2. This enables heat, which is transferred from the sensor-arrangement region R1 to the dissipator region R2, to be transferred to the conductor patterns 331*e*1, 331*c*1, 331*c*2, and 331*d*1. The heat transferred to the conductor patterns 331*e*1, 331*c*1, 331*c*2, and 331*d*1 is further transferred to the housing 2 via the dissipator plate 36, and thereafter dissipated from the housing 2.

This configuration enables the housing 2 to be electrically isolated from the image sensor 33*a*, thus reducing the occurrence of radiation noise caused by noise generated by the image sensor 33*a*. This configuration also enables heat generated from the image sensor 33*a* to be efficiently dissipated from the housing 2.

Note that the corresponding conductor patterns 331 of the portion of the camera board 33, where the internally threaded holes 33*b* are formed, are unexposed on the inner walls of the internally threaded holes 33*b*. This enables the screws 35 to be electrically isolated from the conductor patterns 331. In FIG. 16, the through via-hole 331*a* serves as a part of the wires through which the signals including information about the picked-up images are transferred, but a plurality of through via-holes 331*a* are actually formed. One of the plurality of through via-holes 331*a* serves as a part of the wires for power supply of the camera board 33, and another one of the plurality of through via-holes 331*a* serves as a part of the wires for grounding of the camera board 33. Each of the conductor patterns 331 has a predetermined layout in which the corresponding conductor pattern 331 is comprised of divided pattern elements in the horizontal direction thereof; the horizontal direction is perpendicular to the lamination direction of the conductor patterns 331. The outermost conductor pattern 331*e*1, which is located to be closest to the dissipator plate 36, is electrically isolated from the other conductor patterns 331*d*1 and 331*c*1 to c3 connected to the image sensor 33*a* in the dissipator region R2. This enables no electrical path P2 to be established from the camera board 33 to the dissipator plate 36 and the housing 2. In addition, the surface of the housing 2 is coated with an insulator paint, so that the dissipator plate 36 is electrically isolated from the housing 2. This reliably prevents electrical path P2 from being established.

The dissipator region R2 includes no conductor pattern corresponding to the fifth conductor pattern 331*c* in the sensor-arrangement region R1. This enables a sufficiently long distance between the adjacent conductor patterns 331*e*1 and 331*c*1 in the lamination direction of the camera board 33 to be established. This reduces the capacitance of the capacitor defined by the adjacent conductor patterns 331*e*1 and 331*c*1. Specifically, the capacitance C of the capacitor defined by the adjacent conductor patterns 331*e*1 and 331*c*1 is expressed as the following equation [1]:

$$C = \in S/d$$

Where S represents the surface of the conductor pattern 331*e*1, which faces the surface of the conductor pattern 331*c*1, and d represents the distance between the adjacent conductor patterns 331*e*1 and 331*c*1.

Thus, the longer the distance d between the adjacent conductor patterns 331*e*1 and 331*c*1 is, the lower the capacitance C of the capacitor defined by the adjacent conductor patterns 331*e*1 and 331*c*1.

If the distance d of the insulator 330 located between the adjacent conductor patterns 331*e*1 and 331*c*1 serving as the capacitor were short, an increase of the frequency of noise generated from the image sensor 33*a* could increase the possibility of an alternating current component flowing through the electrical path P2 including the capacitor. This is because an alternating current with a frequency higher than a predetermined threshold frequency can flow through the capacitor. Thus, a reduction of the capacitance between the adjacent conductor patterns 331e1 and 331c1 enables the threshold frequency to increase, making it possible to shift the frequency range of noise, which can pass through the adjacent conductor patterns 331e1 and 331c1 to the higher side, and attenuate the noise. This therefore reduces the occurrence of radiation noise caused by noise generated by the image sensor 33a.

The dissipator region R2 according to the first embodiment preferably includes no conductor pattern corresponding to at least one of the conductor patterns 331 in the sensor-arrangement region R1. The dissipator region R2 can include conductor patterns corresponding to all the conductor patterns 331 in the sensor-arrangement region R1 depending on the frequency range of noise generated from the image sensor 33a. That is, how conductor patterns in the dissipator region R2 are formed to match with the conductor patterns 331 in the sensor-arrangement region R1 can be determined depending on the frequency range of noise generated from the image sensor 33a.

It is preferable that at least two conductor patterns are symmetrically arranged in the lamination direction, i.e. the thickness direction, of the camera board 33. Conductor patterns, which match with the first to fifth conductor patterns 331 in the sensor-arrangement region R1, can be formed to respectively join to the corresponding first to fifth conductor patterns 331. As illustrated in FIG. 16, the dissipator region R2 includes no conductor pattern corresponding to the fifth conductor pattern 331c in the sensor-arrangement region R1 for electrical isolation of the camera board 33 from the housing 2. For this reason, for maintaining the symmetricity of the conductor patterns in the dissipator region R2 about a horizontal plane HP passing through the middle point of the thickness of the camera board 33 and perpendicular to the thickness direction, the dissipator region R2 includes no conductor pattern corresponding to the second conductor pattern 331c in the sensor-arrangement region R1. The enables the number of remaining conductor patterns disposed at the dissipator-plate side about the horizontal plane HP to be symmetrical to the number of remaining conductor patterns disposed at the other side about the horizontal plane HP. Even if the thermal expansion coefficient of each of the conductor patterns 331 and that of the insulator 330 differ from one another, the structure of the camera board 33 according to the first embodiment reduces the difference in expansion or contraction between (1) The first side of the camera board 33 with respect to the horizontal plane HP in the thickness direction (2) The second side of the camera board 33 with respect to the horizontal plane HP in the thickness direction when heat is applied to the camera board 33. This enables the warpage of the camera substrata 33 to be reduced.

The above imaging device 1 according to the first embodiment is configured to electrically connect the image sensor 33a to the image processing circuit 79 of the control circuit board 4 while electrically isolating the image sensor 33a from the dissipator plate 36 and the housing 2 in the dissipator region R2. This enables the occurrence of radiation noise caused by noise generated by the image sensor 33a to be reduced while enabling heat generated from the image sensor 33a to be efficiently dissipated from the housing 2.

Second Embodiment

Figure 17:
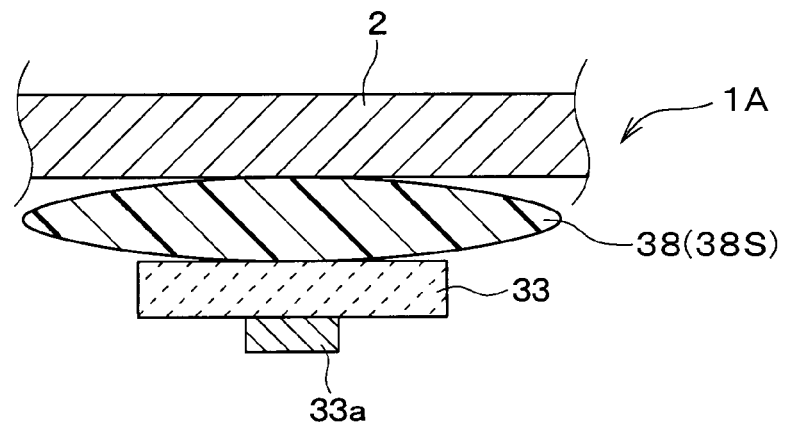
FIG. 17 is a partially schematic lateral cross sectional view of an imaging device according to the second embodiment of the present disclosure.

The following describes an imaging device 1A according to the second embodiment of the present disclosure with reference to FIG. 17.

The structure and functions of the imaging device 1A according to the second embodiment are mainly different from those of the imaging device 1 according to the first embodiment by the following point.

Referring to FIG. 17, a heat dissipator gel, i.e. a thermal-transfer gel, 38 is disposed between the camera substrate 33 and the housing 2 in place of the dissipator plate 36. The heat dissipator gel 38, referred to simply as a dissipator gel 38, enables heat transfer to be established from the camera board 33 to the housing 2. An insulator material, such as a resin, can be used as the dissipator gel 38. For example, a silicone gel can be used as the dissipator gel 38. If the dissipator gel 38 is made of an insulator material, there is no electrical path 2 between the camera board 33 and the electronic components 41 via the housing 2. In addition to the dissipator gel 38 serving as an electrical insulator, the camera board 33 configured like the first embodiment prevents the electrical path 2 from being established more reliably.

The dissipator gel 38 can be used together with the dissipator plate 36. Both the dissipator plate 36 and dissipator gel 38 can be configured to dissipate therefrom heat generated from the image sensor 33a via the housing 2.

Third Embodiment

Figure 18:
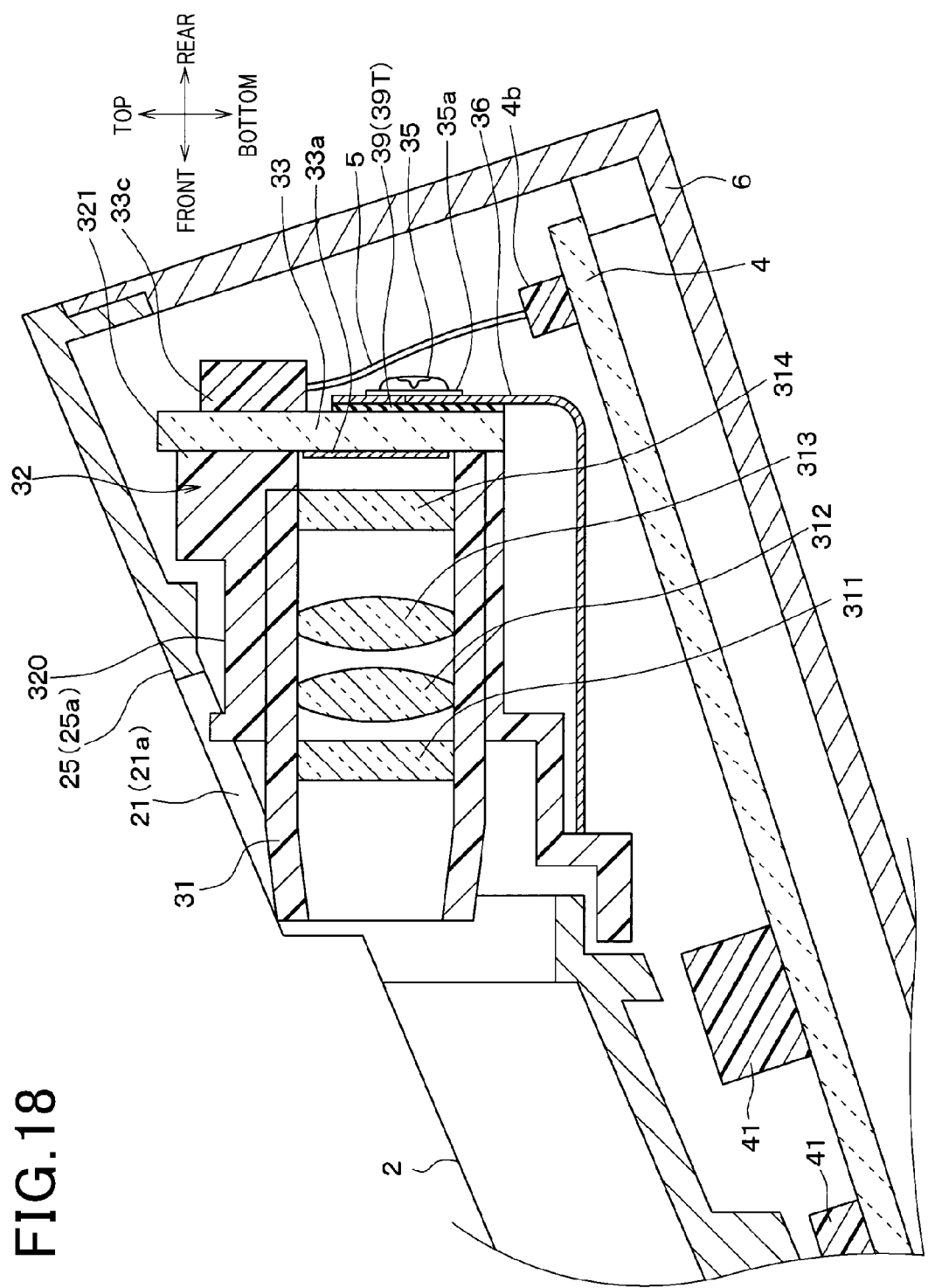
FIG. 18 is a schematic cross sectional view of an imaging device according to the third embodiment of the present disclosure, which corresponds to FIG. 14.

The following describes an imaging device 1B according to the third embodiment of the present disclosure with reference to FIG. 18.

The structure and functions of the imaging device 1B according to the third embodiment are mainly different from those of the imaging device 1 according to the first embodiment by the following point.

Referring to FIG. 18, an insulator sheet 39 is disposed between the rear surface of the camera board 33 and at least the first end portions 36b of the dissipator plate 36. That is, each externally threaded screw 35 is fitted through the corresponding washer 35a, the corresponding first end portion 36b, the insulator sheet 39, the corresponding internally threaded holes 33b and 321a in the internally threaded groove 27a. This enables the externally threaded portion of the externally threaded screw 35 to be engaged with the internally threaded holes 33b and 321a and the internally threaded groove 27a. For example, a silicon sheet or acrylic sheet can be used as the insulator sheet 39.

The configuration of the imaging device 1B enables the insulation performance between the camera board 33 and the dissipator plate 36 to be improved, making it possible to prevent the electrical path 2 from being established more reliably.

Fourth Embodiment

Figure 19:
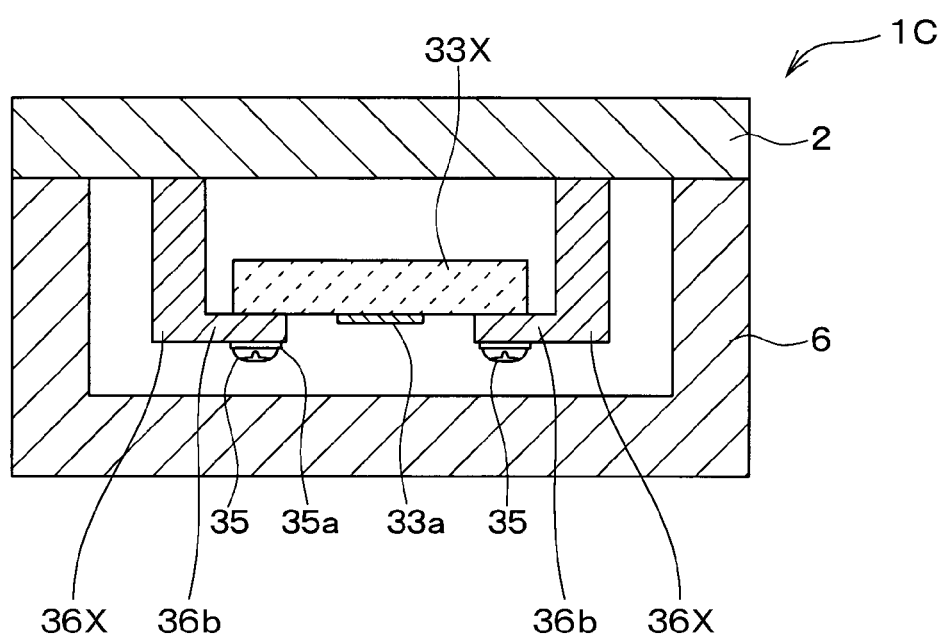
FIG. 19 is a schematic lateral cross sectional view of an imaging device according to the fourth embodiment of the present disclosure, which corresponds to FIG. 14.
Figure 20:
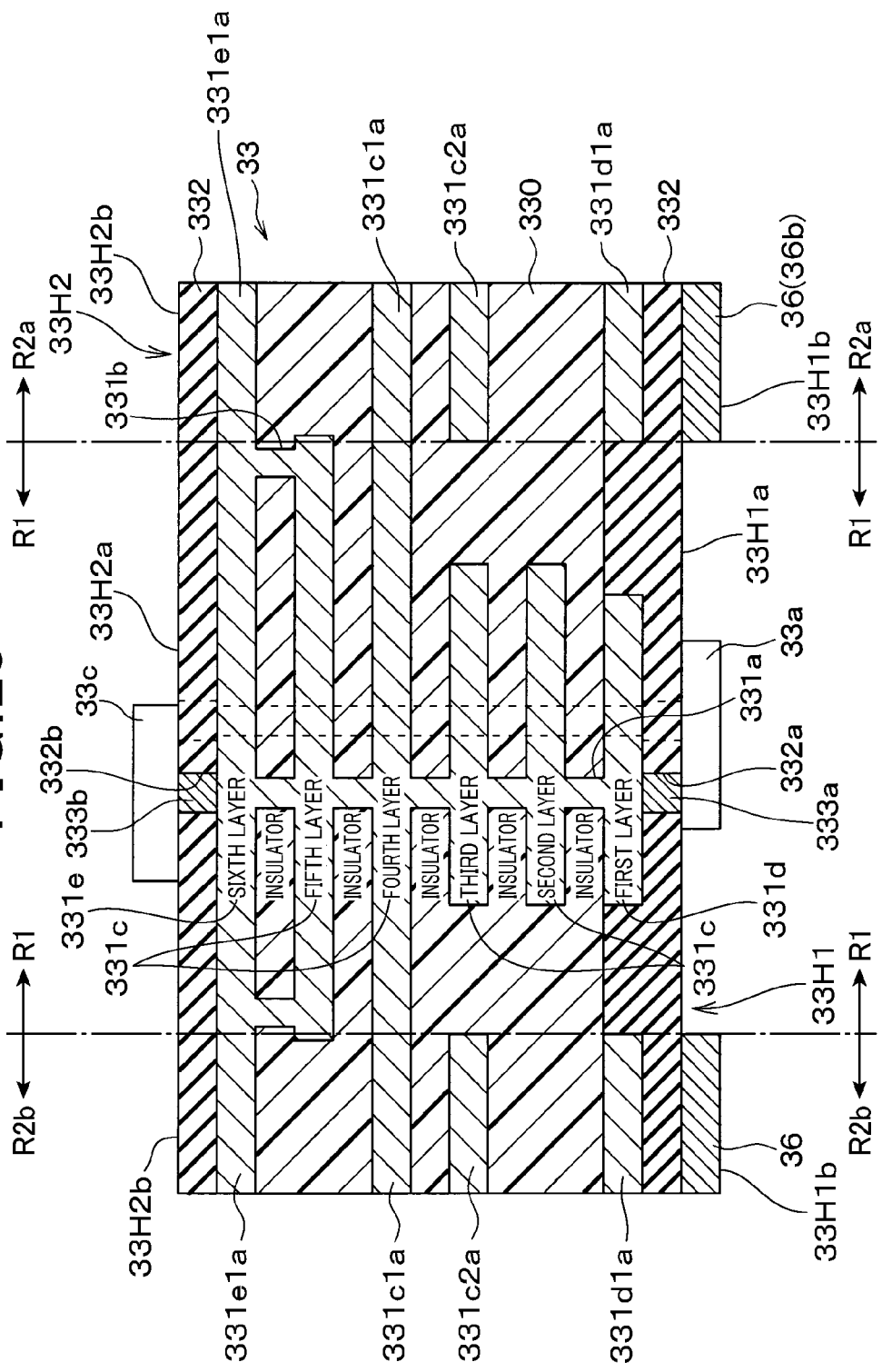
FIG. 20 is a vertical cross sectional view of the camera board according to the fourth embodiment.

The following describes an imaging device 1C according to the fourth embodiment of the present disclosure with reference to FIGS. 19 and 20.

The structure and functions of the imaging device 1C according to the fourth embodiment are mainly different from those of the imaging device 1 according to the first embodiment by the following point.

Referring to FIG. 19, the imaging device 1C according to the fourth embodiment is configured such that the image sensor 33a is disposed on the front surface of a camera board 33X and a dissipator plate 36X is fastened to the front surface of the dissipator plate 36. Specifically, the projecting end of each of the first end portions 36b of the dissipator plate 36 is mounted on the corresponding internally threaded hole 33b on the front surface of the camera board 33X. Each externally threaded screw 35 is fitted through the corresponding washer 35a, and the corresponding first end portion 36b in the corresponding internally threaded hole 33b. Each of the internally threaded holes 33b can be designed as an internally threaded groove. This enables the externally threaded portion of the externally threaded screw 35 to be engaged with the internally threaded hole 33b.

The camera board 33A according to the fourth embodiment preferably has the following structure illustrated in FIG. 20 as an example.

The sensor-arrangement region R1 of the camera board 33A is similar to the sensor-arrangement region R1 of the camera board 33 according to the first embodiment.

As illustrated in FIG. 20, the connector 33c is mounted on the first region 33H2a of the second outermost surface 33H2 like the first embodiment. In contrast, one of the first end portions 36b of the dissipator plate 36 is mounted on the right-side second region 33H1b of the first outermost surface 33H 1 with respect to the sensor-arrangement region R1. In addition, the other of the first end portions 36b of the dissipator plate 36 is mounted on the left-side second region 33H1b of the first outermost surface 33H1 with respect to the sensor-arrangement region R1. The right-side second region 33H2b of the second outermost surface 33H2 is opposite to the right-side second region 33H2b of the first outermost surface 33H1, and the left-side second region 33H2b of the second outermost surface 33H2 is opposite to the left-side second region 33H2b of the first outermost surface 33H1.

That is, the camera board 33X is partitioned into (1) The sensor-arrangement region R1 defined between the first region 33H1a of the first outermost surface 33H1 and the first region 33H2a of the second outermost surface 33H2 of the camera board 33X (2) A right-side dissipator region R2a defined between the right-side second region 33H1b of the first outermost surface 33H1 and the right-side second region 33H2b of the second outermost surface 33H2 of the camera board 33X (3) A left-side dissipator region R2b defined between the left-side second region 33H1b of the first outermost surface 33H1 and the left-side second region 33H2b of the second outermost surface 33H2 of the camera board 33X.

Each of the dissipator regions R2a and R2b of the camera board 33X does not include all the first conductor pattern 331d, the second to fifth conductor patterns 331c, and the sixth conductor pattern 331e. Each of the dissipator regions R2a and R2b of the camera board 33X includes conductor patterns corresponding to some of the first conductor pattern 331d, the second to fifth conductor patterns 331c, and the sixth conductor pattern 331e.

Specifically, each of the dissipator regions R2a and R2b of the camera board 33X includes a conductor pattern 331d1a, which corresponds to the first conductor pattern 331d. The conductor pattern 331d1a in each of the dissipator regions R2a and R2b, which is located closest to the dissipator plate 36, is electrically isolated from the corresponding the first conductor pattern 331d in the sensor-arrangement region R1. None of the dissipator regions R2a and R2b of the camera board 33X have a conductor pattern corresponding to the second conductor pattern 331c, and a conductor pattern 331c2a that is electrically isolated from the corresponding the third conductor pattern 331c in the sensor-arrangement region R1. The conductor pattern 331c2a faces the conductor pattern 331d1a via the corresponding insulator 330. Each of the dissipator regions R2a and R2b of the camera board 33X includes no conductor pattern corresponding to the fifth conductor pattern 331c in the sensor-arrangement region R1.

In contrast, each of the dissipator regions R2a and R2b includes a conductor pattern 331c1a, which is located to be sufficiently far from the dissipator plate 36, integrally joined to the corresponding fourth conductor pattern 331c in the sensor-arrangement region R1. Each of the dissipator regions R2a and R2b includes a conductor pattern 331e1a, which is located to be sufficiently far from the dissipator plate 36, integrally joined to the corresponding sixth conductor pattern 331e in the sensor-arrangement region R1.

As described above, at least part of the conductor patterns, i.e. the conductor patterns, 331d1a, 331c2a, 331c1a, and 331e1a is joined to a corresponding one of the conductor patterns 331d, 331c, 331c, and 331e. This enables heat to be more transferable to the dissipator plate 36 via the at least part of the conductor patterns 331d1a, 331c2a, 331c1a, and 331e1a; the conductor patterns 331d1a, 331c2a, 331c1a, and 331e1a have a higher thermal conductivity than the insulator 330 does.

In addition, one of the conductor patterns 331d1a, 331c2a, 331c1a, and 331e1a, which is located closest to the dissipator plate 36, is electrically isolated from the conductor patterns 331 in the sensor-arrangement region R1. This eliminates the occurrence of the current path P2 between the housing 2 and the control circuit board 4. This disables currents from flowing between the image sensor 33a and the electronic components 41.

The conductor patterns 331d1a, 331c2a, 331c1a, and 331e1a in each of the dissipator regions R2a and R2b are arranged to at least partly face one another via the corresponding insulator 330. This enables heat to be more transferable among the conductor patterns 331d1a, 331c2a, 331c1a, and 331e1a in each of the dissipator regions R2a and R2b. This enables heat, which is transferred from the sensor-arrangement region R1 to each of the dissipator regions R2a and R2b, to be transferred to the conductor patterns 331d1a, 331c2a, 331c1a, and 331e1a. The heat transferred to the conductor patterns 331d1a, 331c2a, 331c1a, and 331e1a is further transferred to the housing 2 via the dissipator plate 36, and thereafter dissipated from the housing 2.

This configuration enables the housing 2 to be electrically isolated from the image sensor 33a, thus reducing the occurrence of radiation noise caused by noise generated by the image sensor 33a. This configuration also enables heat generated from the image sensor 33a to be efficiently dissipated from the housing 2.

Fifth Embodiment

Figure 21:
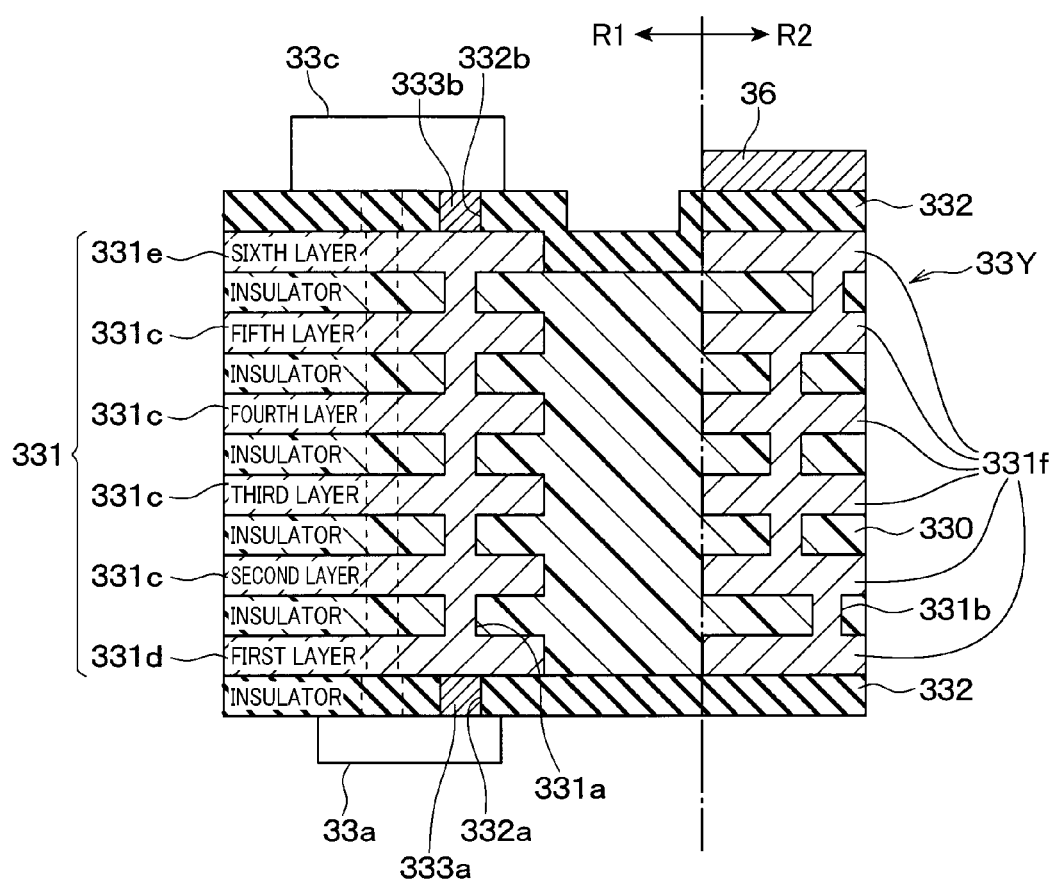
FIG. 21 is a vertical cross sectional view of the camera board according to the fifth embodiment of the present disclosure.

The following describes an imaging device 1D according to the fifth embodiment of the present disclosure with reference to FIG. 21.

The structure and functions of the imaging device 1D according to the fifth embodiment are mainly different from those of the imaging device 1 according to the first embodiment by the following point.

Referring to FIG. 21, the dissipator region R2 of a camera board 33Y includes conductor patterns 331f, each of which corresponds to one of the first to sixth conductor pattern 331d, 331c, and 331e in the sensor-arrangement region R1. Each of the conductor patterns 331f in the dissipator region R2 is electrically isolated from a corresponding one of the first to sixth conductor pattern 331d, 331c, and 331e.

At least one of the conductor patterns 331f can be eliminated. In particular, the conductor patterns 331f in the dissipator region R2, which are electrically isolated from all the first to sixth conductor pattern 331d, 331c, and 331e in the sensor-arrangement region R1, enables the heat conductivity in the dissipator region R2 to be more improved. The blind via-holes 331b are each formed in the insulator 330 to electrically connect between a corresponding adjacent pair of the conductor patterns 331f. The conductor patterns 331f electrically connected to each other by the blind via-holes 331b enables heat to be more transferable in the dissipator region R2.

The conductor patterns 331f in the dissipator region R2 are arranged to face one another via the corresponding insulator 330. This enables heat to be more transferable among the conductor patterns 331f in the dissipator region R2. This configuration of the imaging device 1D enables the housing 2 to be electrically isolated from the image sensor 33a, thus reducing the occurrence of radiation noise caused by noise generated by the image sensor 33a. This configuration also enables heat generated from the image sensor 33a to be efficiently dissipated from the housing 2.

The present disclosure is not limited to the aforementioned embodiments. Elements of each of the imaging devices 1 to 1D are not essential to imaging devices within the scope of the present disclosure except where the elements are clearly described as essential elements or the elements are obviously to be essential. Even if the number of elements, the values of elements, the amounts of elements, and the ranges of elements are disclosed in the specification, the present disclosure is not limited thereto except where they are clearly described as essential or they are principally estimated to be essential. Even if the shapes, locations, and positional relationships of elements are disclosed in the specification, the present disclosure is not limited thereto except if they are clearly described as essential or they are principally estimated to be essential.

Specifically, the following modifications can be included within the scope of the present disclosure, and the modifications can be selectively applied to the first to fifth embodiments in combination or alone. That is, at least some of the modifications can be freely applied to the first to fifth embodiments.

The features disclosed in the first to fifth embodiments can be freely combined with one another within the scope of the present disclosure.

The heat dissipator plate 36 is used as a thermal transfer member in for example the first embodiment. A graphite sheet 36G, which has a high heat transfer rate, i.e. thermal conductivity, can be used as a thermal transfer member in place of the heat dissipator plate 36. Specifically, a graphite sheet 36G, which is used in place of the heat dissipator plate 36, can be fastened to the camera board 33 with the screws 35, or can be adhered to the camera board 33 in the dissipator region with, for example, an adhesive.

The imaging device with such a graphite sheet 36G as a thermal transfer member enables superior heat dissipation characteristics to be achieved because the graphite sheet 36G has high heat transfer rate. A graphite sheet can be simply disposed between the camera board 33 and the housing 2. Note that the graphite sheet 36G is thin and has a high dielectric constant. Thus, in order to reliably achieve sufficient electrical isolation characteristics, it is preferable that a first portion of the graphite sheet 36G is in contact with the camera board 33 and a second portion, which is sufficiently away from the first portion, of the graphite sheet 36G is in contact with the camera board 33. This configuration is similar to the configuration of the dissipator plate 36 illustrated in FIG. 13.

Both the dissipator plate 36 or a graphite sheet and the dissipator gel 38 described in the second embodiment can be used. Both the dissipator plate 36 or a dissipator sheet, such as a silicone sheet or an acrylic sheet, in place of the dissipator gel 38 can also be used.

Each of the first to fifth embodiments uses a heat transfer member, such as the dissipator plate 36 or the dissipator gel 38, which is designed as an individual member separated from the housing 2, but the present disclosure is not limited thereto. Specifically, a part of the housing 2 can serve as a heat transfer member. Specifically, a part 2P of the housing 2 can be directly in contact with the camera board 33 in the dissipator region R2 (see phantom line in FIG. 14). This configuration permits the part 2P of the housing 2 to serve as a heat transfer member. That is, the part 2P of the housing 2 enables heat generated from the image sensor 33a to be directly transferred from the camera board 33 to the housing 2.

The assembly of the housing 2 and the bottom case 7 serves as a case housing the components of the imaging device 1, such as the image sensor 33a, the camera board 33, and the control circuit board 4, but the present disclosure is not limited thereto. Specifically, one of cases having various shapes and/or configurations, which can house the components of the imaging device 1, can be used.

The insulator sheet 39 is disposed between the dissipator plate 36 and the camera board 33 according to the third embodiment, but a thermal transfer sheet 39T made of a material having a high heat transfer rate, such as a graphite material, can be disposed between the dissipator plate 36 and the camera board 33 in place of the insulator sheet 39.

While the illustrative embodiment and its modifications of the present disclosure have been described herein, the present disclosure is not limited to the embodiment and its modifications described herein. Specifically, the present disclosure includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:
1. An imaging device comprising:
a metallic case comprising an opening;
an image sensor housed in the case and configured to acquire, through the opening, an image of an outside of the case and to output a signal indicative of the acquired image;
an image-sensor board housed in the case and comprising a first region and a second region,
the first region comprising:
a plurality of first conductor patterns;
a plurality of first insulators, the first conductor patterns and the first insulators constituting a multilayer structure, the first conductor patterns being electrically connected to each other;
a first outermost surface on which the image sensor is mounted; and
a second outermost surface opposite to the first outermost surface;
the second region comprising:
a plurality of second conductor patterns; and a plurality of second insulators, the second conductor patterns and the second insulators constituting a multilayer structure; and a control circuit board electrically connected to the first conductor patterns via the second outermost surface so that the signal output from the image sensor is transferred to the control circuit board via the first conductor patterns; and a thermal transfer member disposed to be in contact with the second region of the image-sensor board for transferring heat generated from the image sensor to the case, the second conductor patterns in the second region including a closest conductor pattern located closest to the thermal transfer member, the closest conductor pattern being electrically isolated from the first conductor patterns.

2. The imaging device according to claim 1, wherein at least one of the second conductor patterns except for the closest conductor pattern in the second region is connected to one of the first conductor patterns in the first region.

3. The imaging device according to claim 2, wherein the thermal transfer member is in contact with the second outermost surface, and the at least one of the second conductor patterns except for the closest conductor pattern in the second region is located to be far from the thermal transfer member.

4. The imaging device according to claim 1, wherein the first conductor patterns and the first insulators are alternately laminated to constitute the multilayer structure, and at least one of the first conductor patterns faces a corresponding one of the second insulators.

5. The imaging device according to claim 4, wherein the image-sensor board has a predetermined thickness between the first and second outermost surfaces, and the second conductor patterns in the second region are symmetrically arranged in a direction of the thickness of the image-sensor board.

6. The imaging device according to claim 1, wherein all the second conductor patterns in the second region are electrically isolated from the first conductor pattern in the first region.

7. The imaging device according to claim 6, wherein the second conductor patterns in the second region are electrically connected to each other.

8. The imaging device according to claim 1, wherein the thermal transfer member comprises a heat dissipator plate configured to transfer heat generated from the image-sensor board to the case.

9. The imaging device according to claim 1, wherein the thermal transfer member comprises a graphite sheet configured to transfer heat generated from the image-sensor board to the case.

10. The imaging device according to claim 1, further comprising an insulator sheet disposed between the thermal transfer member and the image-sensor board.

11. The imaging device according to claim 1, further comprising a heat transfer sheet disposed between the thermal transfer member and the image-sensor board.

12. The imaging device according to claim 1, further comprising a heat dissipator gel disposed between the image-sensor board and the case.

13. The imaging device according to claim 1, further comprising a heat dissipator sheet 38S disposed between image-sensor board and the case.

14. An image sensor board comprising:
a first region comprising:
a plurality of first conductor patterns;
a plurality of first insulators, the first conductor patterns and the first insulators constituting a multilayer structure, the first conductor patterns are electrically connected to each other;
a first outermost surface on which an image sensor is to be mounted; and
a second outermost surface opposite to the first outermost surface;
a second region comprising:
a plurality of second conductor patterns; and
a plurality of second insulators, the second conductor patterns and the second insulators constituting a multilayer structure,
the first conductor patterns being electrically connectable to a control circuit board via the second outermost surface; and
a thermal transfer member disposed to be in contact with the second region of the image-sensor board for transferring heat generated from the image-sensor board,
the second conductor patterns in the second region including a closest conductor pattern located closest to the thermal transfer member, the closest conductor pattern being electrically isolated from the first conductor patterns.

* * * * *